US008242457B2

(12) United States Patent  
Parker

(10) Patent No.: US 8,242,457 B2  
(45) Date of Patent: Aug. 14, 2012

(54) CHARGED PARTICLE OPTICS WITH AZIMUTHALLY-VARYING THIRD-ORDER ABERRATIONS FOR GENERATION OF SHAPED BEAMS

(75) Inventor: N. William Parker, Pleasanton, CA (US)

(73) Assignees: Multibeam Corporation, Santa Clara, CA (US); Tokyo Electron Limited, Tokyo (JP)

(*) Notice: Subject to any disclaimer, the term of this patent is extended or adjusted under 35 U.S.C. 154(b) by 466 days.

(21) Appl. No.: 12/050,035

(22) Filed: Mar. 17, 2008

(65) Prior Publication Data

US 2008/0224063 A1 Sep. 18, 2008

Related U.S. Application Data

(60) Provisional application No. 60/895,126, filed on Mar. 15, 2007, provisional application No. 60/921,733, filed on Apr. 3, 2007.

(51) Int. Cl.  
*G21K 1/08* (2006.01)

(52) U.S. Cl. ............. 250/396 R; 250/306; 250/307; 250/310; 250/311

(58) Field of Classification Search ........ 250/396 R, 250/396 ML, 492.1, 492.2, 492.23, 492.3  
See application file for complete search history.

(56) References Cited

U.S. PATENT DOCUMENTS

| | | | | |
|---|---|---|---|---|
| 5,994,709 A | * | 11/1999 | Suzuki | 250/492.23 |
| 6,388,402 B1 | * | 5/2002 | De Jong et al. | 315/368.28 |
| 7,619,218 B2 | * | 11/2009 | Nakano et al. | 250/306 |
| 2002/0015143 A1 | * | 2/2002 | Yin et al. | 355/133 |
| 2003/0010926 A1 | * | 1/2003 | Lanio | 250/396 R |
| 2004/0004192 A1 | * | 1/2004 | Krivanek et al. | 250/396 R |
| 2004/0119021 A1 | * | 6/2004 | Parker et al. | 250/396 R |

(Continued)

FOREIGN PATENT DOCUMENTS

WX 02005124816 * 12/2005

OTHER PUBLICATIONS

Chang, et al "Multiple electron-beam lithography" Microelectronic Engineering, vol. 57-58, Sept 2001, pp. 117-135.*  
International Search Report issued Jul. 30, 2008 in corresponding PCT/US2008/57259.

(Continued)

*Primary Examiner* — Michael Maskell  
(74) *Attorney, Agent, or Firm* — Robert O. Groover, III; Seth A. Horwitz

(57) ABSTRACT

A charged particle shaped beam column includes: a charged particle source; a gun lens configured to provide a charged particle beam approximately parallel to the optic axis of the column; an objective lens configured to form the charged particle shaped beam on the surface of a substrate, wherein the disk of least confusion of the objective lens does not coincide with the surface of the substrate; an optical element with 8N poles disposed radially symmetrically about the optic axis of the column, the optical element being positioned between the condenser lens and the objective lens, wherein N is an integer greater than or equal to 1; and a power supply configured to apply excitations to the 8N poles of the optical element to provide an octupole electromagnetic field. The octupole electromagnetic field is configured to induce azimuthally-varying third-order deflections to the beam trajectories passing through the 8N-pole optical element. By controlling the excitation of the 8N poles a shaped beam, such as a square beam, can be formed at the surface of the substrate. The 8N-pole element can be magnetic or electrostatic.

19 Claims, 29 Drawing Sheets

U.S. PATENT DOCUMENTS

| | | | |
|---|---|---|---|
| 2004/0188635 A1* | 9/2004 | Kawasaki et al. | 250/492.3 |
| 2005/0017194 A1* | 1/2005 | Matsuya et al. | 250/396 R |
| 2006/0033037 A1* | 2/2006 | Kawasaki et al. | 250/398 |
| 2006/0145087 A1* | 7/2006 | Parker | 250/396 R |
| 2006/0145097 A1* | 7/2006 | Parker | 250/492.22 |
| 2006/0219935 A1* | 10/2006 | Henstra | 250/396 ML |
| 2007/0164228 A1* | 7/2007 | Frosien | 250/396 ML |
| 2007/0257207 A1* | 11/2007 | Frosien et al. | 250/492.3 |

OTHER PUBLICATIONS

Chang et al., "Multiple electron-Beam Lighography", *Microelectronic Engineering*, vol. 57-58, Sept 2001, pp. 117-135.

Chakarian, et al., "Lighographic Performance Results for a New 50 kV Electron Beam Mask Writer", *Annual BACUS Symposium on Photomask Technology*, vol. 4816, No. 20, Monterey, CA, 2001, pp. 1-15.

* cited by examiner

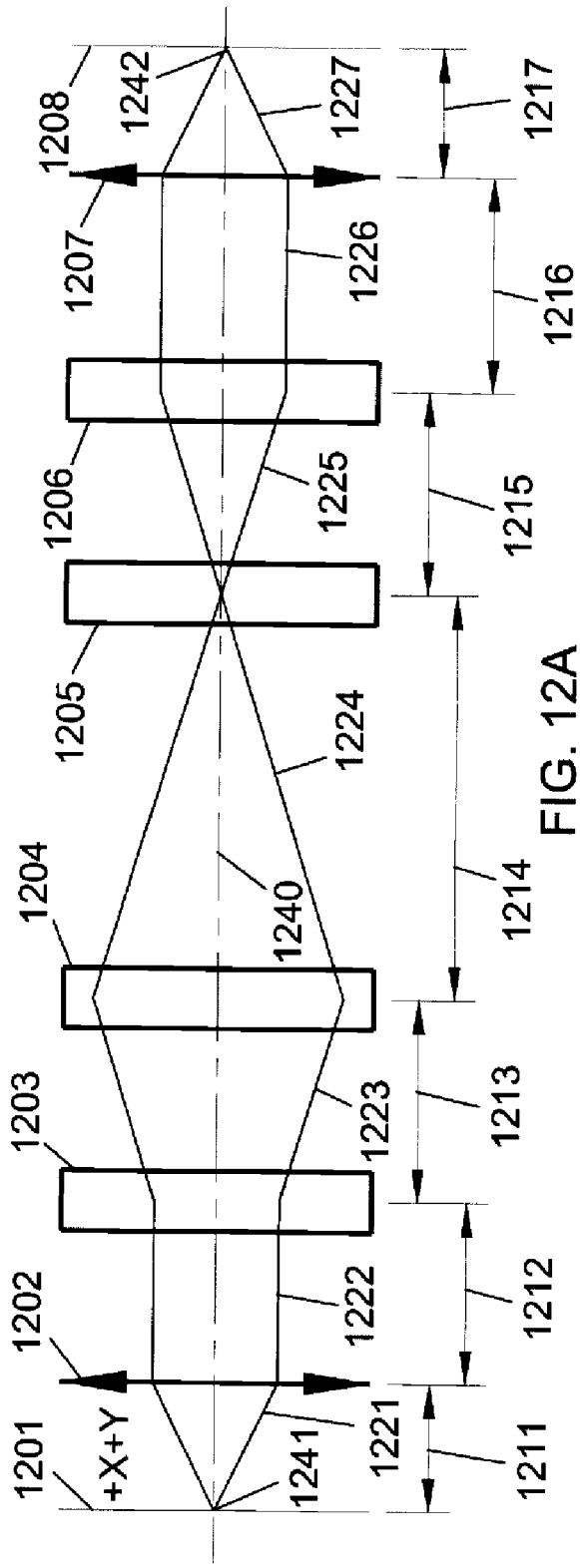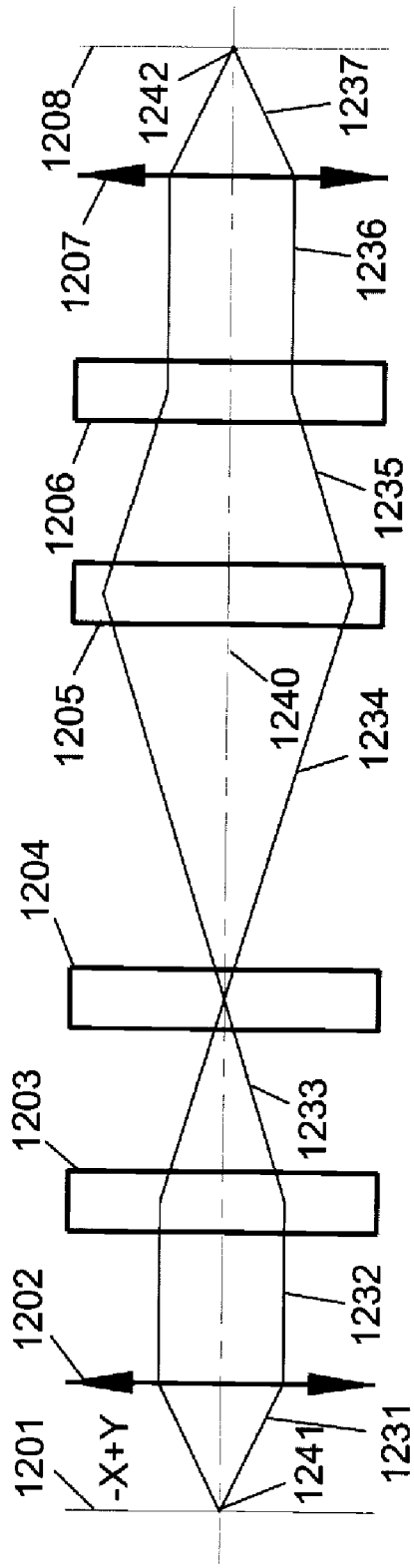

CHARGED PARTICLE OPTICS WITH AZIMUTHALLY-VARYING THIRD-ORDER ABERRATIONS FOR GENERATION OF SHAPED BEAMS

CROSS-REFERENCE TO RELATED APPLICATIONS

This application claims the benefit of U.S. Provisional Applications Ser. Nos. 60/895,126 filed Mar. 15, 2007 and 60/921,733 filed Apr. 3, 2007.

BACKGROUND OF THE INVENTION

1. Field of Use for the Invention

This invention relates to the field of charged particle optics, and in particular to systems for generation of high current density shaped electron beams.

2. Description of the Related Art

The use of electron beams to lithographically pattern semiconductor masks, reticles and wafers is an established technique. The different lithography strategies may be characterized by the following key parameters: beam positioning strategy; and beam shape control.

There are two main approaches to the positioning of electron beams for the exposure of resist during the lithographic process:

(a) Raster Scanning, where the beam is moved on a regular two-dimensional lattice pattern. This method has the advantage that the scan electronics is typically simpler, but the disadvantage is that the beam may spend large amounts of time moving across areas not needing to be exposed. In addition, in order to accomplish very precise pattern edge placement, sophisticated gray-scale and/or multiple-pass scanning may be required.

(b) Vector Scanning where the beam is moved two-dimensionally directly to areas to be written. This method has the advantage of reduced time over areas not needing to be exposed, but the disadvantage of more complicated and expensive deflection electronics. Precise pattern edge placement is also easier, utilizing the beam placement capability on a 2D address grid much smaller than the beam size.

Each approach is advantageous in certain circumstances, the optimum choice depending on the critical dimensions of the pattern, pattern density (% of area to be written), and also on the profile of the beam current distribution.

There are two well-known approaches to the shaping of the electron beam used to expose the resist on the substrate:

(a) Gaussian beams are characterized by the highest current densities (typically >2000 A/cm$^2$) since in these systems, an image of the electron source is focused onto the substrate surface, thereby taking full advantage of the high brightness of the source. A key disadvantage of Gaussian beams is their long tails of current, stretching far outside the central beam diameter—only 50% of the beam current at the substrate falls within the FWHM of a two-dimensional Gaussian distribution.

(b) Shaped Beams are formed by electron optical columns typically having several intermediate shaping apertures, combined with additional deflectors and lenses to form a focused image of the aperture(s) on the substrate surface. These systems typically have beam current densities orders-of-magnitude lower (e.g. 20-50 A/cm$^2$) than for the Gaussian beams. An advantage of these systems is the reduced current tails outside the desired beam shape, making patterning less susceptible to process fluctuations. Another advantage is that effectively a large number of pixels may be written simultaneously since the area of the variable shaped beam may be large in comparison to a single pixel—this has the effect of increasing the writing throughput since fewer "flashes" of the electron beam are required to write a pattern.

There is a need in the semiconductor industry to achieve the highest patterning throughputs, both for mask and reticle writing as well as potentially for the direct writing of wafers. Either of the two approaches to beam positioning can be combined with either of the two approaches to beam shaping, but none of these four combinations is capable of fully meeting the semiconductor industry's needs. Clearly there is a need for an electron lithography system having high throughput (at least several wafers/hour or less than an hour to write a reticle), combined with the ability to pattern very small CDs with edge placement accuracies <CD/8, as well as the simplest possible electron optical design to ensure adequate system reliability, long mean-time-between-failures (MTBF) and short mean-time-to-repair (MTTR).

A third possible contribution to increasing throughput is to use multiple beams in parallel to lithographically pattern a single wafer. The challenges associated with using multiple beams include: scaling electron beam columns to fit multiple columns over a single wafer; stitching together the areas patterned by different columns; and the complexity and hardware costs associated with multiple columns.

In order to achieve high throughput, there is clearly a need to have a writing system with two or three of the following characteristics:

1) multiple beams writing in parallel on the same substrate;
2) a high beam current density in a shaped beam;
3) an efficient writing strategy such as vector scanning.

There is a need for a lithography system which makes best use of the above three characteristics.

SUMMARY OF THE INVENTION

The present invention provides an optical column for charged-particle direct-writing which generates a high current density charged particle beam, coupled with the ability to dynamically shape the beam into non-circular profiles at the substrate being written on. According to aspects of the invention, a first embodiment of the charged particle shaped beam column includes: a charged particle source; a gun lens configured to provide a charged particle beam approximately parallel to the optic axis of the column; an objective lens configured to form the charged particle shaped beam on the surface of a substrate, wherein the disk of least confusion of the objective lens does not coincide with the surface of the substrate; an optical element with 8N poles disposed radially symmetrically about the optic axis of the column, the optical element being positioned between the condenser lens and the objective lens, wherein N is an integer greater than or equal to 1; and a power supply configured to apply excitations to the 8N poles of the optical element to provide an octupole electromagnetic field. The octupole electromagnetic field induces azimuthally-varying third-order deflections to the beam trajectories passing through the 8N-pole optical element. These beam deflections, when combined with spherical aberration in the optical system and defocus in the objective lens, induce an azimuthally-varying effective spherical aberration which causes the beam profile to deviate from circularity. By controlling the excitation of the 8N poles, it is possible to generate a square beam at the substrate, or a partially-square beam with rounded corners. The 8N-pole element can be a magnetic 8N-pole element, where the excitation is a current, or an electrostatic 8N-pole element, where the excitation is a voltage. The charged particle beam may be an electron or ion beam.

The 8N pole optical element allows for a fully rotatable octupole field for N>2. The larger the value of N, the more control there is over the quadrupole and octupole fields generated. However, large values of N result in greater complexity and cost. The invention is not limited to generating square beams at the surface of the substrate. Other shapes, such as rectangles may also be generated using the structure and method of the present invention. For example, with the addition of non-octupole excitations, rectangular or parallelogram-shaped beams are possible.

Further aspects of the first embodiment of the invention include a method of forming a charged particle shaped beam in a charged particle optical column. The method includes the steps of: forming a charged particle beam approximately parallel to the optic axis of the charged particle column; creating an octupole electromagnetic field to induce azimuthally dependent deflection of the charged particle beam, wherein the azimuthal angle is about the optic axis of the charged particle column, in a plane perpendicular to the optic axis; and forming a charged particle shaped beam on a substrate.

A second embodiment of the present invention enables more complete control of the beam profile at the substrate. According to aspects of the invention, a second embodiment of a charged particle shaped beam column includes: a charged particle source; a gun lens configured to provide a charged particle beam approximately parallel to the optic axis of the column; an objective lens configured to form the charged particle shaped beam on the surface of a substrate; and four non-circular symmetry optical elements, each comprising 8N poles, where N is greater than or equal to 1, and N may be different for each optical element. The first 8N-pole element is excited to generate a quadrupole electromagnetic field which induces a defocusing action on the beam in a first plane (see FIG. 12A), and a focusing action on the beam in a second plane perpendicular to the first plane (see FIG. 12B). Due to this defocusing/focusing action of the first 8N-pole element, the beam profile is a first line at the second 8N-pole element. The second 8N-pole element is excited to generate a combined quadrupole and octupole electromagnetic field which induces a focusing action on the beam in the first plane and no focusing action on the beam in the second plane. Combined with the focusing action at the second 8N-pole element, the octupole excitation applied to the second 8N-pole element induces a third-order beam deflection along a first axis (the first axis being contained within the first plane).

Due to this focusing action of the second 8N-pole element, the beam profile is a second line at the third 8N-pole element, where the second line is oriented 90° azimuthally with respect to the first line at the second 8N-pole element. The third 8N-pole element is excited to generate a combined quadrupole and octupole electromagnetic field which induces no focusing action on the beam in the first plane and a focusing action on the beam in the second plane. Combined with the focusing action at the third 8N-pole element, the octupole excitation induces a third-order beam deflection along a second axis (the second axis being contained within the second plane).

Due to this focusing action of the third 8N-pole element, the beam profile is circular at the fourth 8N-pole element. The fourth 8N-pole element is excited to generate a combined quadrupole and octupole electromagnetic field which induces a focusing action on the beam in the first plane and a defocusing action on the beam in the second plane. Combined with the focusing action at the fourth 8N-pole element, the octupole excitation induces an azimuthally-varying third-order beam deflection.

The combination of the third-order beam deflections at the second, third and fourth 8N-pole elements combines with the spherical aberration (which is azimuthally-symmetric) and defocus (also azimuthally-symmetric) to generate an azimuthally-varying beam deflection at the surface of the substrate to be written on. With proper control of the octupole excitations on the second, third and fourth 8N-poles, it is possible to generate either a square beam or a square beam with rounded corners at the surface of the substrate.

The advantage of the second embodiment over the first embodiment is the more complete control of the beam profile, including the beam shape and edge acuity (i.e., the rate of current drop at the edge of the beam, measured in A/cm$^2$ per nm of distance perpendicular to the beam edge.). The advantage of the first embodiment over the second embodiment is a simpler optical system, requiring the addition of only a single 8N-pole element.

Further aspects of the present invention include a high throughput charged particle direct write lithography system including the charged particle shaped beam columns described herein. The system includes: a charged particle optical assembly configured to (1) produce a multiplicity, N, of high current density charged particle non-circular shaped-beams focused on the surface of a substrate and (2) vector scan the charged particle shaped-beams across the surface of the substrate; wherein each of the multiplicity of high current density charged particle shaped-beams has a current density, $I_a$, and an area A which satisfy the equations:

$I_a \geq 1000$ Ampères per square centimeter;

$300 \geq N \geq 10$;

$A = p^2$; and $120 > p > 10$ nanometers; and wherein said charged particle optical assembly includes N charged particle columns, each of the charged particle columns forming a charged particle beam, each of the charged particle columns including at least one optical element with 8N poles disposed radially symmetrically about the optic axis of the column, N being an integer greater than or equal to 1, each of the optical elements being configured to produce azimuthally dependent deflection of the corresponding charged particle beam, the azimuthal angle being about the optic axis of the corresponding charged particle column, in a plane perpendicular to the optic axis.

In further aspects of the invention the parameter space for the high throughput charged particle direct write lithography system may be varied. For example, $I_a \geq 5000$ Amperes per square centimeter; $100 \geq N \geq 10$; and $120 > p > 20$ nanometers, where $A = p^2$.

BRIEF DESCRIPTION OF THE FIGURES

FIG. 12A shows a schematic side view in the +X+Y plane of a second embodiment of the present invention.

FIG. 12B shows a schematic side view in the −X+Y plane of a second embodiment of the present invention.

DETAILED DESCRIPTION

The invention disclosed herein is a charged particle beam column comprising one or more quadrupole/octupole elements which deflect the charged particle beam going down the column. The beam deflections due to the quadrupole/octupole element(s) effectively create azimuthally-varying radial deflections to the beam trajectories which, when combined with spherical aberration and defocus in the objective lens, result in forming a high current-density shaped (i.e., non-circular) beam at the substrate surface.

The charged particle beam column of the invention can be either an electron beam or an ion beam column. The quadrupole/octupole optical elements can be electrostatic or magnetic elements. Many of the examples of the invention provided herein are examples of electron beam columns, with electrostatic quadrupole/octupole optical elements. However, the invention is equally applicable to ion beam columns and columns with magnetic quadrupole/octupole optical elements.

Two embodiments of the present invention are described in detail herein:

1) Embodiment #1 which comprises a single additional quadrupole/octupole element (implemented using an 8N-pole optical element with combined quadrupole and octupole excitations), and
2) Embodiment #2 which comprises a quadrupole element followed by three quadrupole/octupole elements (wherein all four elements may be implemented using 8N-pole optical elements with combined quadrupole and octupole excitations).

The first embodiment is described in FIGS. 6-11 and the second embodiment in FIGS. 12A-21. The relative advantages and disadvantages of the two embodiments are discussed in detail.

Figure 1A:
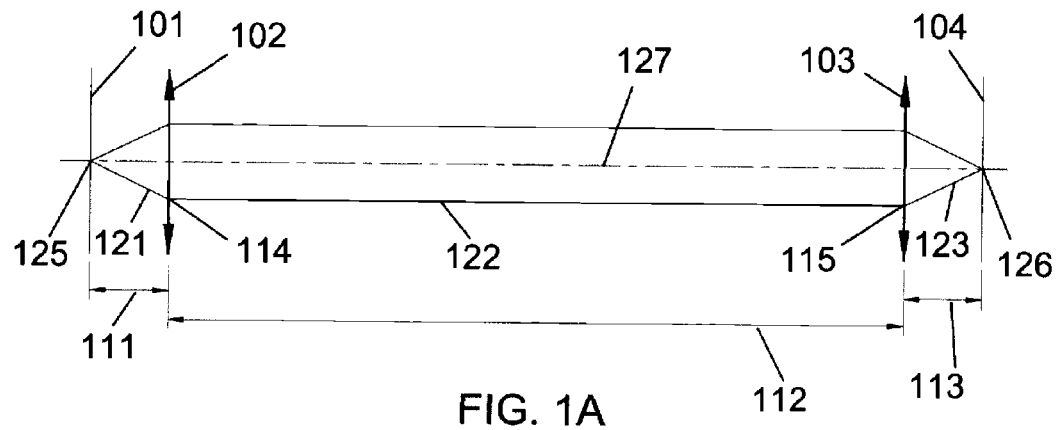
FIG. 1A shows a schematic side view of a column employing two lenses.
Figure 1B:
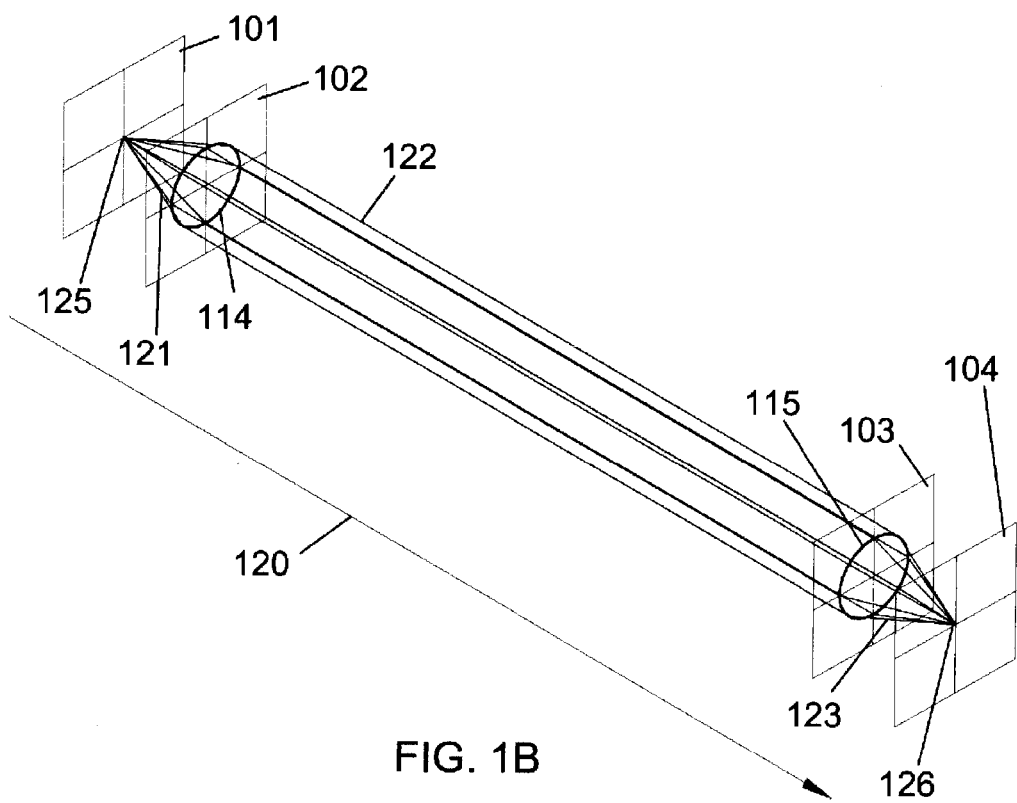
FIG. 1B shows an isometric view of the two-lens column in FIG. 1A.
Figure 2:
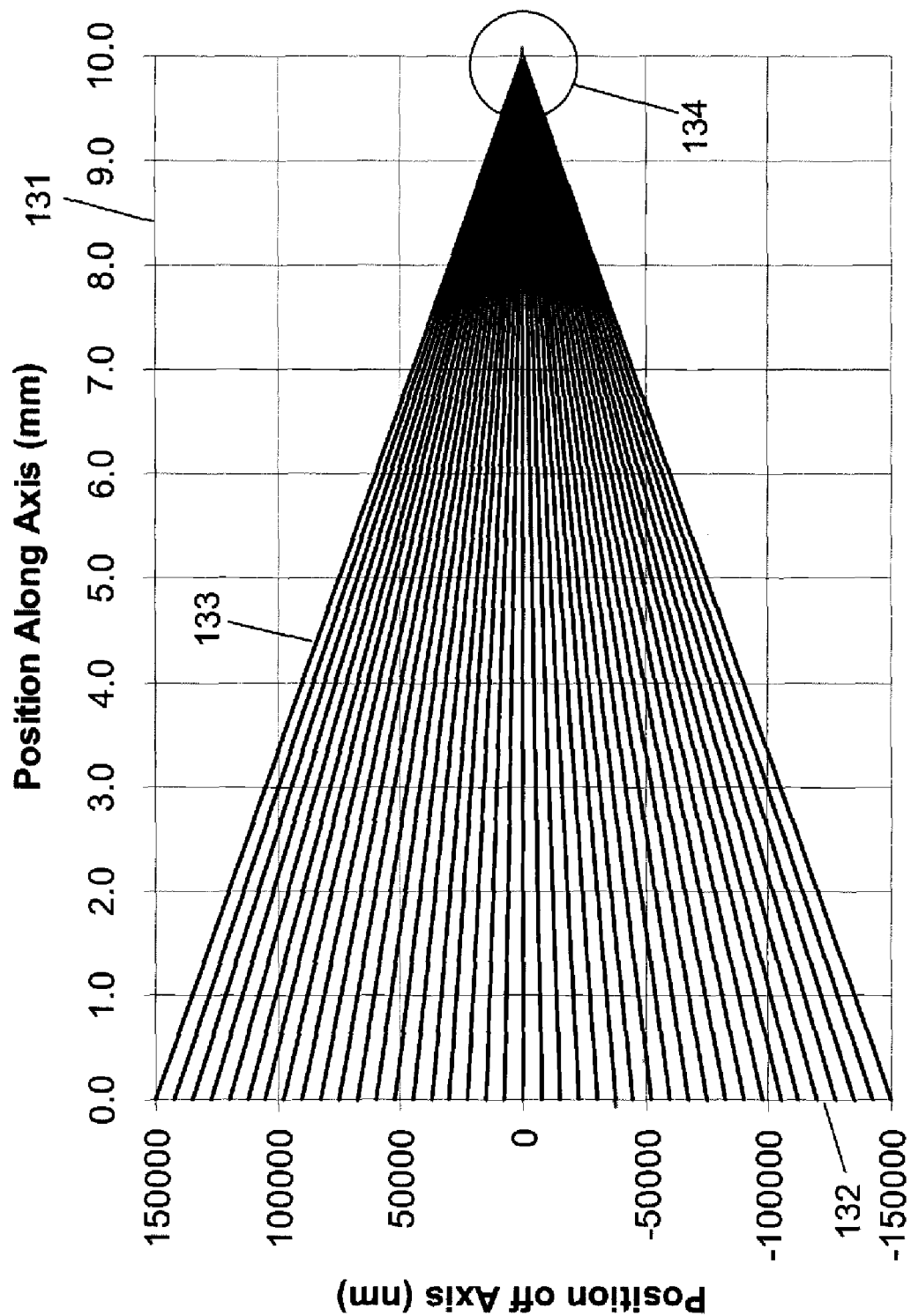
FIG. 2 shows a side view of electron trajectories converging to a focused spot on a substrate surface in a two-lens column.
Figure 3:
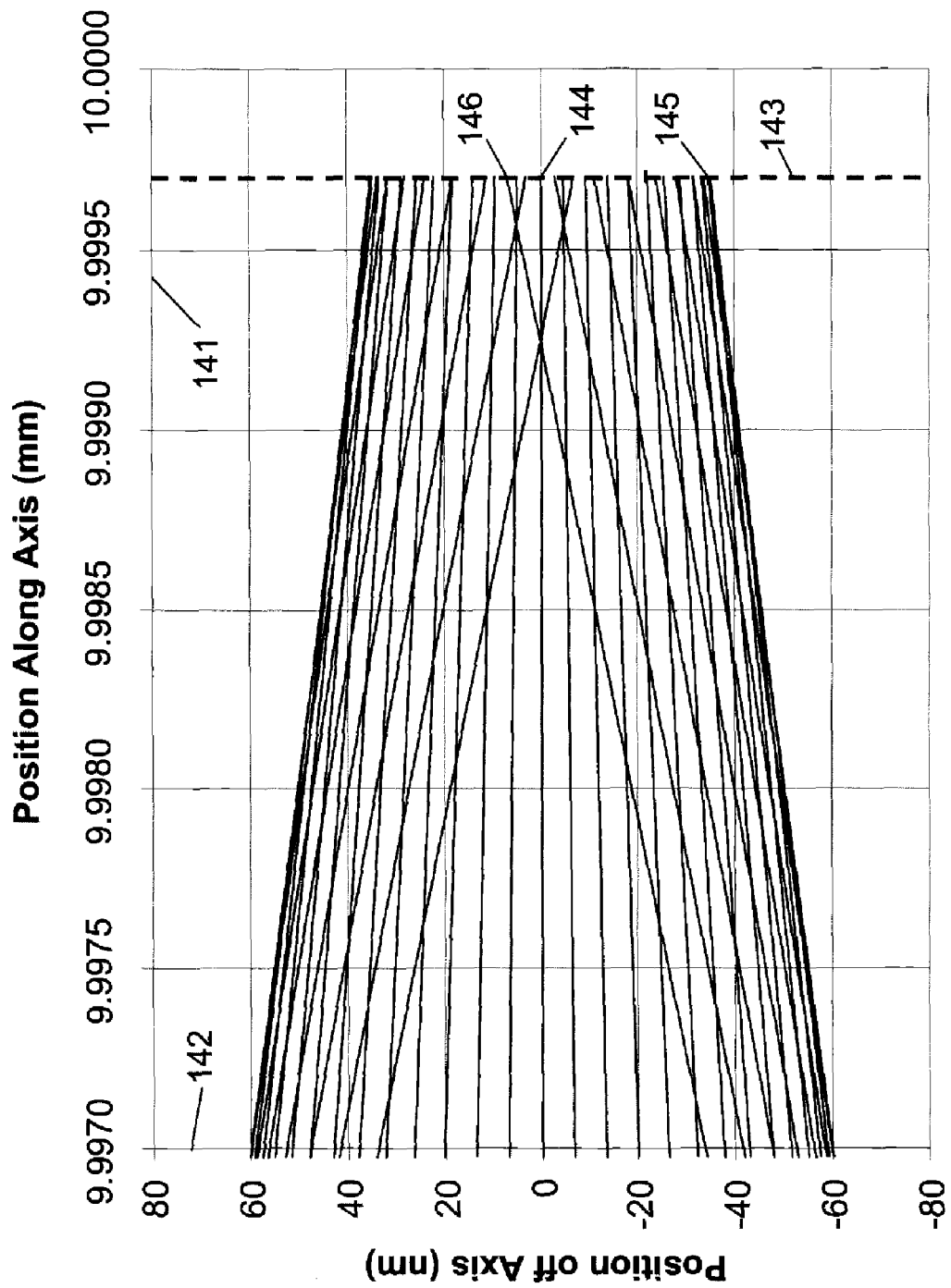
FIG. 3 shows a close-up side view of electron trajectories converging to a focused circle of roughly 72 nm diameter on a substrate surface in a two-lens column.
Figure 4:
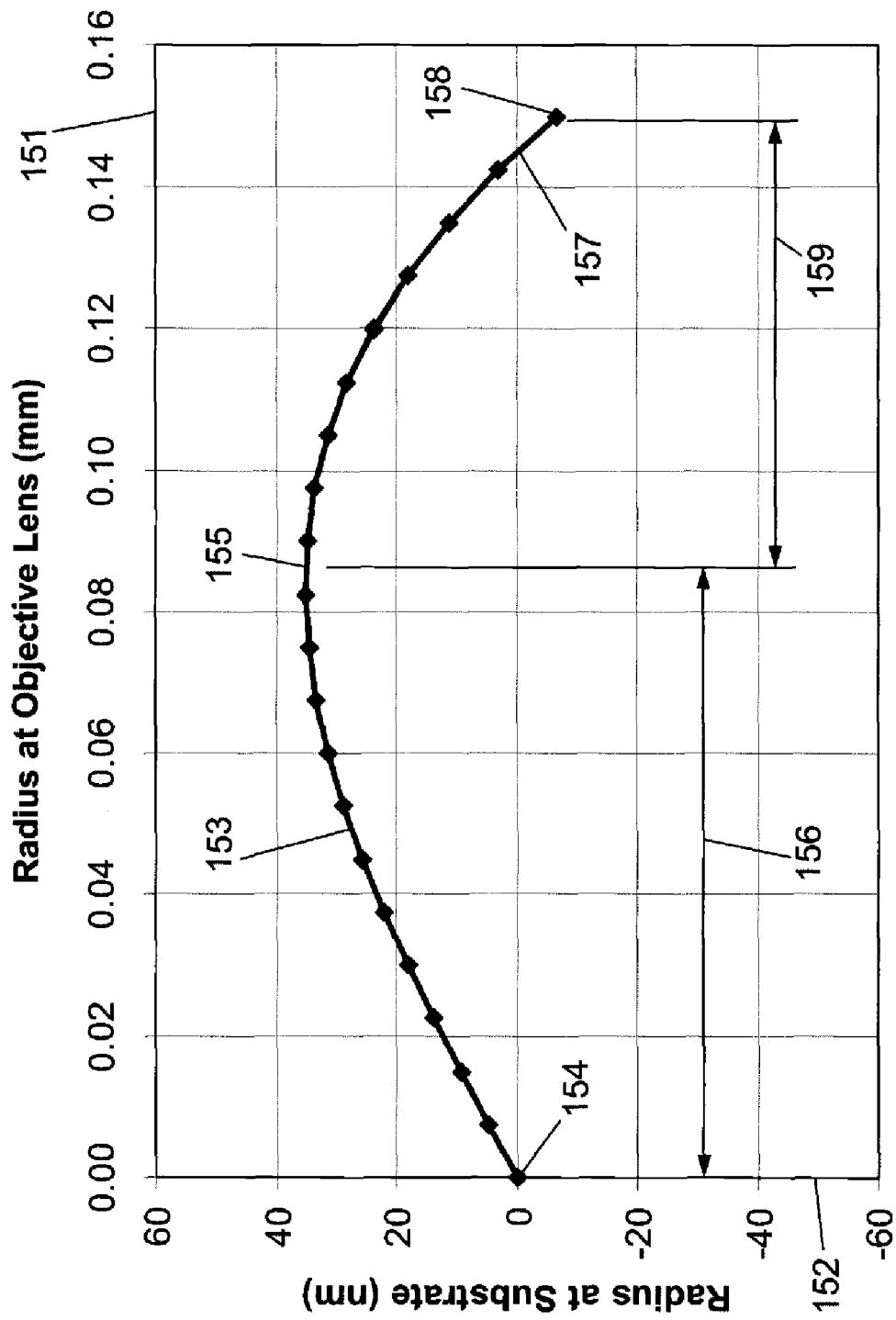
FIG. 4 shows a graph of the radii of the electron trajectories at the substrate surface against the radii of the trajectories at the objective lens in a two-lens column.

Before describing the present invention, it is useful to first characterize the operation of a simple two-lens optical column in the absence of the present invention, as shown in FIGS. 1A-5. The present invention may be implemented in a one-lens column, but general industry practice (familiar to those skilled in the art) is to use at least two lenses in a charged particle optical column: 1) a gun (or "condenser") lens in the electron gun to collect electrons emitted from the source (typically emitted into an expanding cone-shaped distribution) and focus their trajectories into a roughly parallel beam, which may converge to a crossover before the beam reaches the objective lens, and 2) an objective lens which focuses the electron beam generated by the gun onto a target surface. Such a two-lens column is shown in FIGS. 1A-B, for the case where there is no intermediate beam crossover between the gun lens and objective lens. The first embodiment of the present invention is applicable to columns having no intermediate crossover, as well as to columns having a single intermediate crossover. FIGS. 3-4 characterize the optical performance of the two-lens column shown in FIGS. 1A-B. The particular settings of the gun and objective lenses which generate the trajectories in FIGS. 3 and 5, and the graph in FIG. 4, have been selected for their applicability to the first embodiment of the present invention.

FIG. 1A shows a schematic side view of a column employing two lenses. Electrons 121 are emitted from electron source 125 in object plane 101, which can be a thermionic source, a LaB$_6$ emitter, a cold field emitter, a Schottky emitter, or other type of electron source as is familiar to those skilled in the art. Gun lens 102 (with focal length 111) focuses electrons 121 into an approximately parallel electron beam 122 (with radius 114) which passes down the column a distance 112 before reaching the objective lens 103 (with radius 115). Objective lens 103 (with focal length 113) focuses electrons 122 into a converging beam 123 which intersects with the surface of substrate 104 at point 126. Both lenses 102 and 103 are centered on the optical axis 127. In FIG. 1A, substrate 104 is at the paraxial focal plane of objective lens 103.

FIG. 1B shows an isometric view of the two-lens column in FIG. 1A. The arrow 120 shows the direction of electron trajectories down the two-lens column.

FIG. 2 shows a side view of electron trajectories converging to a focused spot on a substrate surface in a two-lens column. At the left of the graph (position 0.0 along horizontal axis 131), the beam diameter is 300000 nm (i.e., 150 μm radius) on vertical axis 132. At the resolution of this graph, electron trajectories 133 are seen to converge towards region 134 which is shown in greater detail in FIG. 3. The focal length of lens 103 (see FIGS. 1A-B) is 10.0060 mm.

FIG. 3 shows a close-up side view of electron trajectories converging to a focused spot on a substrate surface in a two-lens column at region 134 in FIG. 2. The substrate is shown as a dashed line 143 at 9.9997 mm from lens 103 (see FIGS. 1A-B), having a focal length of 10.0060 mm, thus the substrate 143 is (10.0060−9.9997) mm=6.3 μm above the paraxial focal plane. The left vertical axis 142 is at 9.9970 mm from lens 103, which is (9.9997−9.9970) mm=2.7 μm above the substrate surface 143, and the top horizontal axis 141 shows the position along the optical axis 127 from lens 103. The central (on-axis) ray 144 passes from source 125, through lenses 102 and 103, and strikes the substrate 104 all on optical axis 127. Ray 145 is the farthest off-axis ray at substrate 104, but does not correspond to the farthest off-axis ray at lens 103 due to the combined effects of defocus and spherical aberration. The outer ray at lens 103 strikes substrate 104 at a radius of 146, again due to the combined effects of defocus and spherical aberration.

FIG. 4 clarifies the effects of defocus combined with spherical aberration in a two-lens column. At the paraxial focal plane (10.0060 mm from lens 103), the beam displacement off-axis is due solely to spherical aberration:

$$\delta X = -C_s x(x^2+y^2) = \text{x-axis beam displacement at paraxial focal plane}$$

$$\delta Y = -C_s y(x^2+y^2) = \text{y-axis beam displacement at paraxial focal plane}$$

where x and y are the beam coordinates at lens 103. Note that for electron lenses, $C_s$ is always positive in the above formula, so δX and δY are always negative, thus spherical aberration causes the electron trajectories to cross optical axis 127 before reaching the paraxial image plane. Now if we move the substrate 104 above the paraxial image plane, we must add defocus terms to the equations for δX and δY:

$$\delta X = (\Delta f/f)x - C_s x(x^2+y^2)$$

$$\delta Y = (\Delta f/f)y - C_s y(x^2+y^2)$$

where f=the focal length 113 of lens 103, and Δf=the amount of defocus (i.e., the distance above the paraxial focal plane where the substrate is positioned). Clearly, for small x and y, the linear terms dominate δX and δY, but as x and/or y is increased (corresponding to rays which are not paraxial at lens 103), eventually the cubic spherical aberration terms come to dominate δX and/or δY.

FIG. 4 shows a graph 153 of the radii 152 of the electron trajectories at the substrate 104 surface against the radii 151 of the trajectories at objective lens 103 in a two-lens column. The central ray strikes substrate 104 a position 154 (0 nm off-axis)—this corresponds to point 144 in FIG. 3. As the radius 151 at objective lens 103 is increased, defocus initially makes the radii at the substrate 104 increase from 0 mm at point 154 to point 155—this is region 156. For radii at objective lens 103 larger than point 155 (in region 159), spherical aberration starts to dominate and the radii 152 at the substrate 104 start to decrease, crossing the 0 nm axis at point 157 and ending up at point 158 which is on the opposite side of axis 127 (see FIGS. 1A-B) from point 155. This is a common phenomenon familiar to those skilled in the art. The curve 153 is the same for any azimuthal (i.e., angle around the axis 127) initial position of the trajectory at lens 103 since the beam is circular (see FIG. 5). Note that axis 152 includes both positive and negative numbers for the radius at the substrate 104—in this case, a negative radius corresponds to a positive radius of the same magnitude, but rotated azimuthally by 180° around the optical axis 127.

Figure 5:
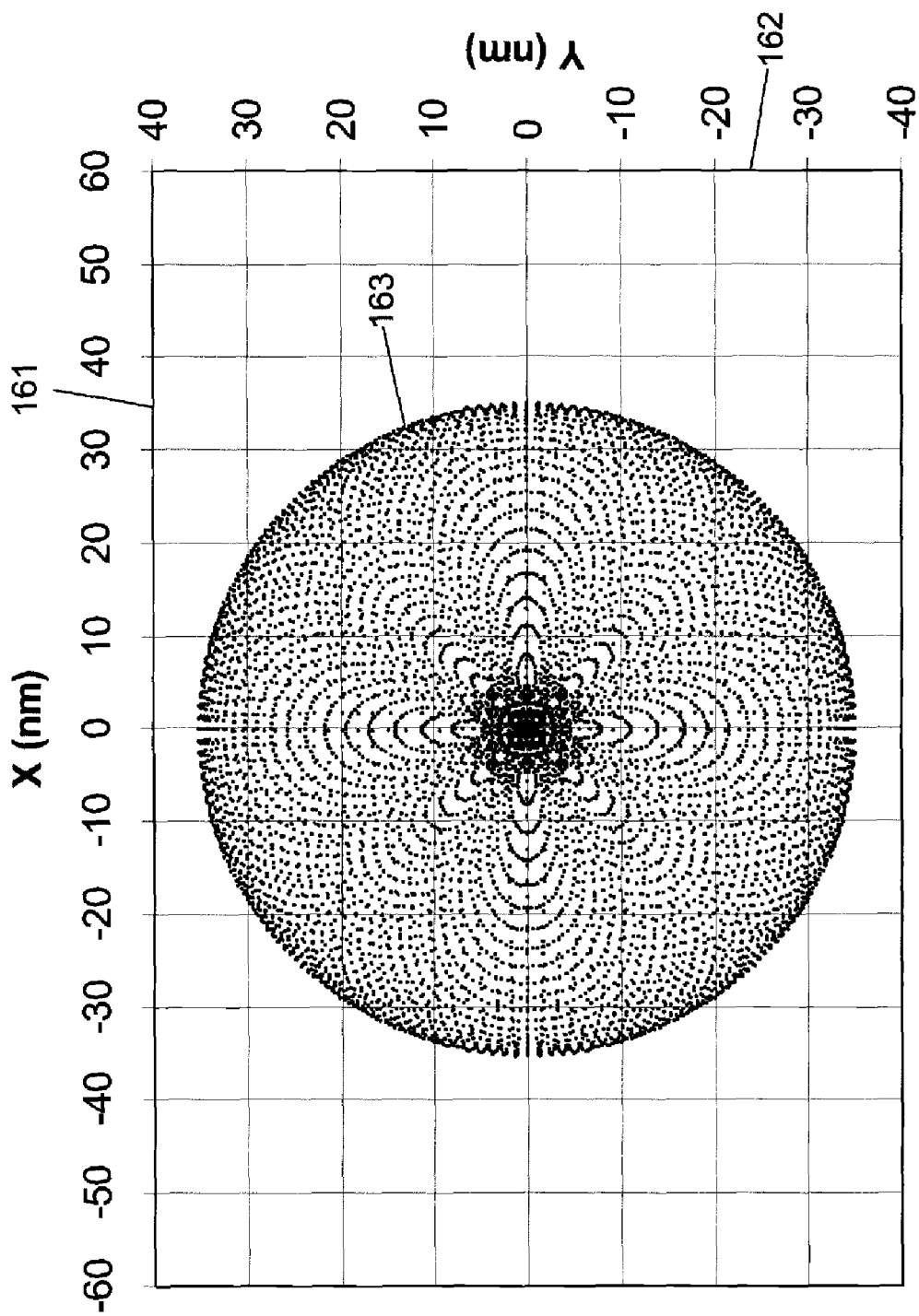
FIG. 5 shows a graph of beams transmitted to the substrate surface in a two-lens column.

FIG. 5 shows a graph of the trajectories 163 along the X-axis 161 and Y-axis 162 at the substrate 104. Since the beam-defining aperture (not shown) is round, the beam at the substrate 104 is also round. The distribution of current within the round beam is determined by the interaction of defocus and spherical aberration as illustrated in FIG. 4. Generally there is a concentration of current around the origin of the X-Y coordinate system at the substrate 104 as shown by the dark area at the center of FIG. 5.

First Embodiment

Figure 6:
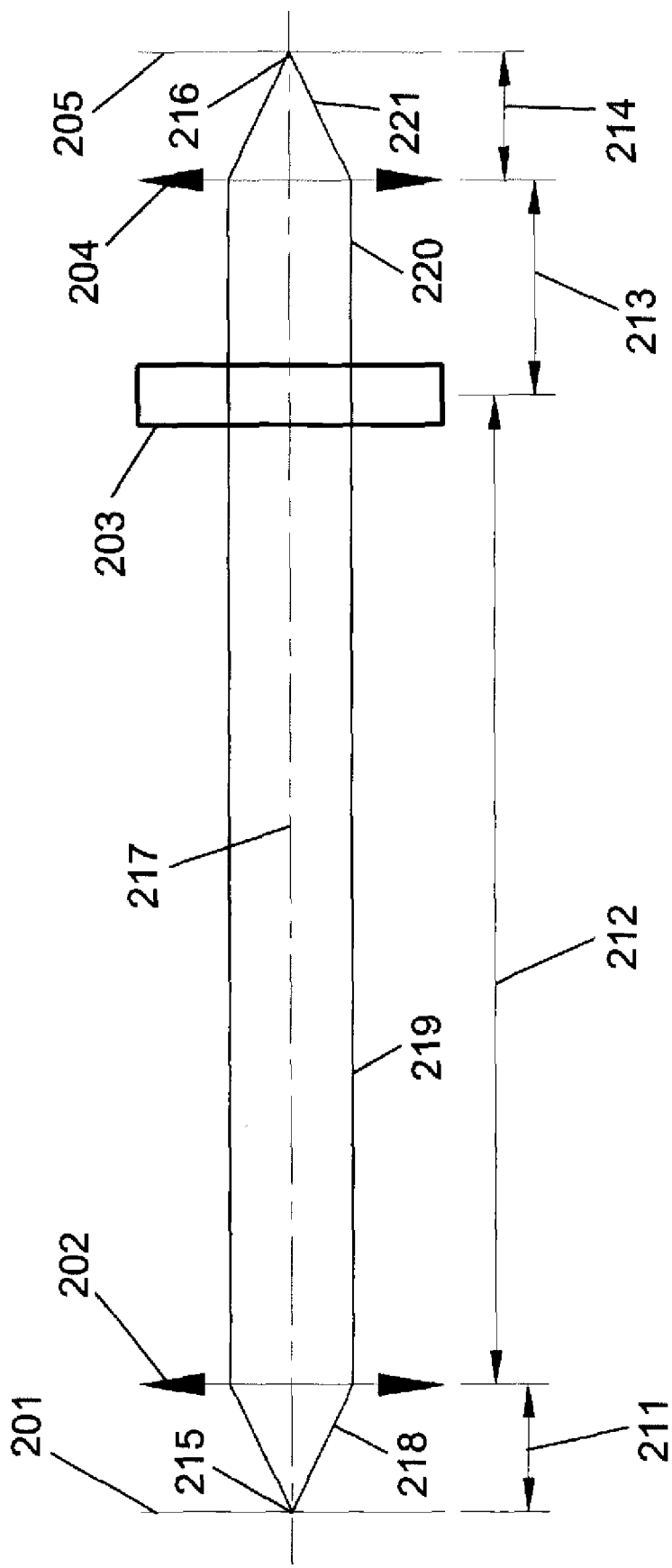
FIG. 6 shows a schematic side view of a first embodiment of the present invention, showing a single combined quadrupole/octupole element 203 added to the two-lens column of FIGS. 1A-B.
Figure 7:
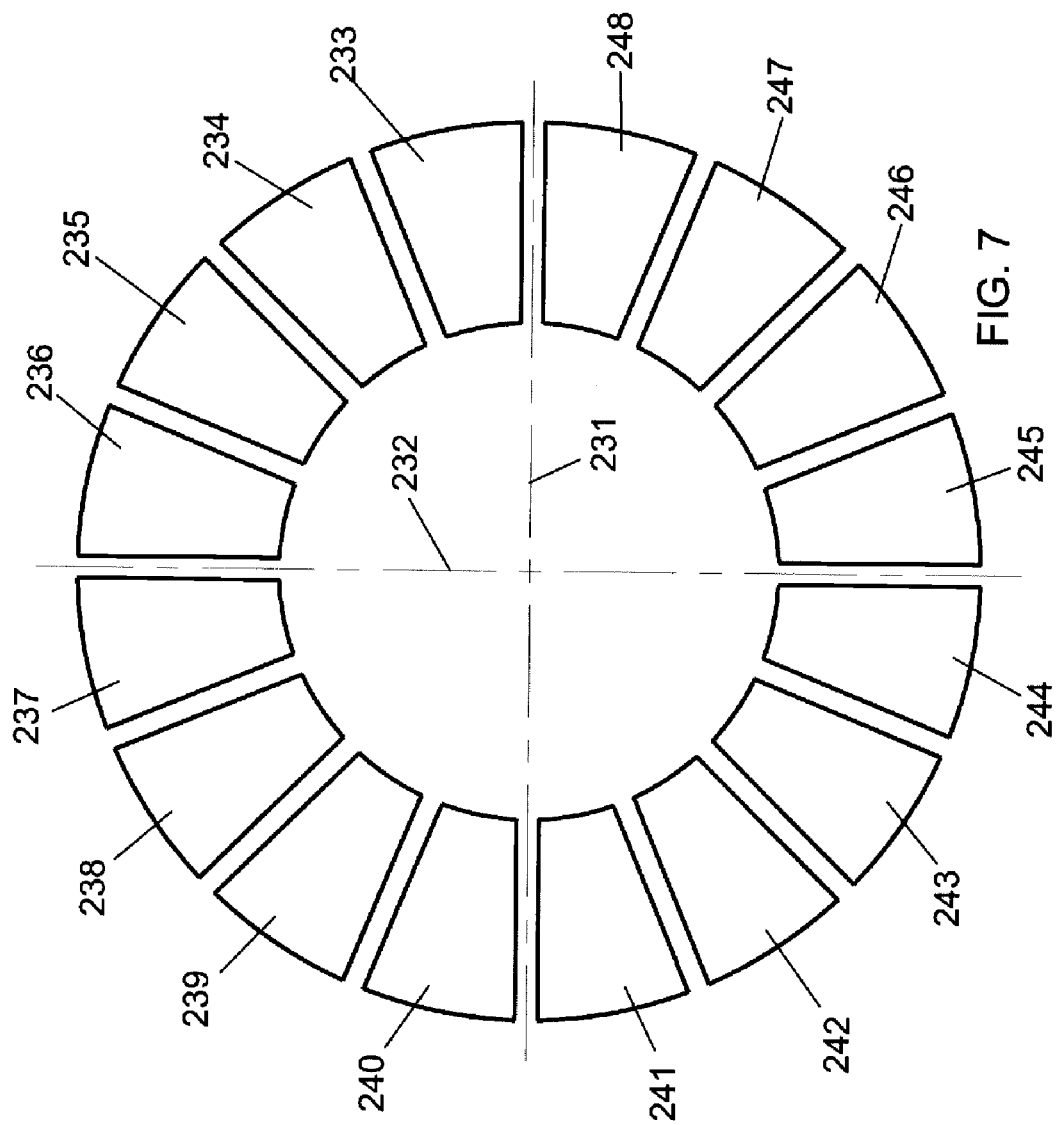
FIG. 7 shows a schematic view of an electrostatic 16-pole optical element as used in first and second embodiments of the present invention.

FIG. 6 shows a schematic side view of a first embodiment of the present invention. Electrons 218 are emitted from electron source 215 in object plane 201, which can be a thermionic source, a LaB$_6$ emitter, a cold field emitter, a Schottky emitter, or other type of electron source as is familiar to those skilled in the art. The particular type of electron source is not part of the present invention. Gun lens 202 (with focal length 211) focuses electrons 218 into an approximately parallel electron beam 219 which passes down the column a distance 212 before reaching octupole 203. Octupole 203 may be implemented in the column using an element with 8N poles, where N=1 (an octupole), 2 (a 16-pole), . . . as is familiar to those skilled in the art. FIG. 7 shows a view of a 16-pole element (N=2). The excitation of octupole 203 is discussed in FIG. 7. Trajectories leaving octupole 203 pass a distance 213 down the column, reaching objective lens 204 (with focal length 214) which focuses electrons 220 into a converging beam 221 which intersects the surface of substrate 205 at location 216. Both lenses 202 and 204 are centered on the optical axis 217.

Implementations of Octupole Elements

Figure 8:
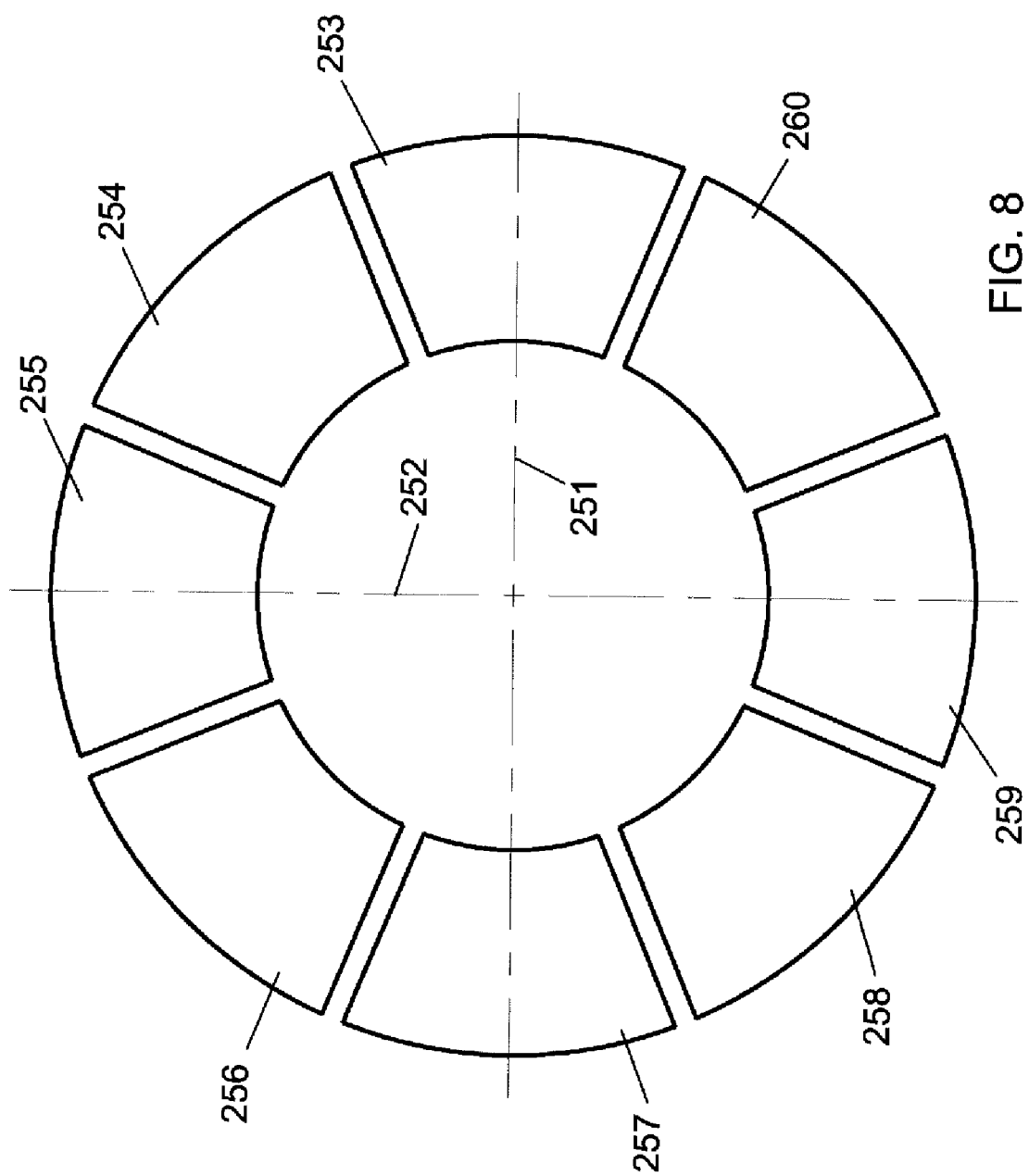
FIG. 8 shows a schematic view of an electrostatic 8-pole optical element as used in first and second embodiments of the present invention.

There are a number of ways to physically implement an octupole element in an electron column. Two of these methods are illustrated in FIGS. 7 and 8. A pure octupole element (i.e., an element not also having dipole, quadrupole, hexapole, or other non-octupole excitations) is characterized by an electrostatic potential, V(x,y), with four-fold symmetry:

$$V(x,y)=A(x^4-6x^2y^2+y^4)+B4(x^3y-xy^3)$$

where A and B are constants, and x and y are the beam coordinates at the octupole element. Since the deflection of the electron trajectories passing through the octupole is proportional to the electric field, $E(x,y)=-\nabla V(x,y)$, the beam deflections at the substrate, δX and δY, are:

$$\delta X=K\partial V(x,y)/\partial x=KA(4x^3-12xy^2)+KB(12x^2y-4y^3)$$

$$\delta Y=KV(x,y)/\partial y=KA(-12x^2y+4y^3)+KB(4x^3-12xy^2)$$

Where K is a constant that depends on the beam energy passing through the octupole, the length and bore of the octupole poles, and the focal length of the objective lens. The constant A corresponds to an octupole oriented along the X- and Y-axes, while the constant B corresponds to an octupole oriented 22.5° relative to the X- and Y-axes. In the following discussion, B=0 for simplicity. For complete generality (i.e., arbitrary orientations of the shaped beam), both A and B would be non-zero.

FIG. 7 shows a schematic view of an electrostatic 16-pole optical element that can be used for octupole 203 (see FIG. 6) in a first embodiment of the present invention, and for elements 1203-1206 (see FIGS. 12A-13B) in a second embodiment of the present invention. The sixteen poles 233-248 are oriented relative to the X-axis 231 and Y-axis 232 as shown. Table I shows octupole excitation voltage polarities for poles 233-248 for this orientation—note that the voltage magnitudes are all the same, only the polarities differ between poles 233-248. For the first embodiment, octupole 203 has no non-octupole excitations, thus the voltages on poles 233-248 will reflect the octupole voltages in Table I only. For the second embodiment, the octupole excitations are combined with quadrupole excitations, thus the voltages on poles 233-248 will be combinations of the octupole voltages shown in Table I with quadrupole voltages in Table V.

FIG. 8 shows a schematic view of an electrostatic 8-pole (octupole) optical element that can be used as an alternative to the 16-pole element described in FIG. 7. The eight poles 253-260 are oriented relative to the X-axis 251 and Y-axis 252 as shown. Table II shows octupole excitation voltage polarities for poles 253-260 for this orientation—note that the voltage magnitudes are all the same, only the polarities differ between poles 253-260. For the first embodiment, octupole 203 has no non-octupole excitations, thus the voltages on poles 253-260 will reflect the octupole voltages in Table II only. For the second embodiment, the octupole excitations are combined with quadrupole excitations, thus the voltages on poles 253-260 will be combinations of the octupole voltages shown in Table II with quadrupole voltages in Table VI.

Table III shows a comparison of the relative advantages and disadvantages of the two octupole implementations shown in FIGS. 7 and 8. The key determinant between the two implementations would be whether all orientations of the beam shape are required for patterning the substrate. In general, usually only orientations along 0° and 45° are needed, so the simpler 8-pole implementation in FIG. 8 would be preferred. If, however, all orientations are required, then it is necessary to use the more complex 16-pole implementation in FIG. 7.

Figure 9:
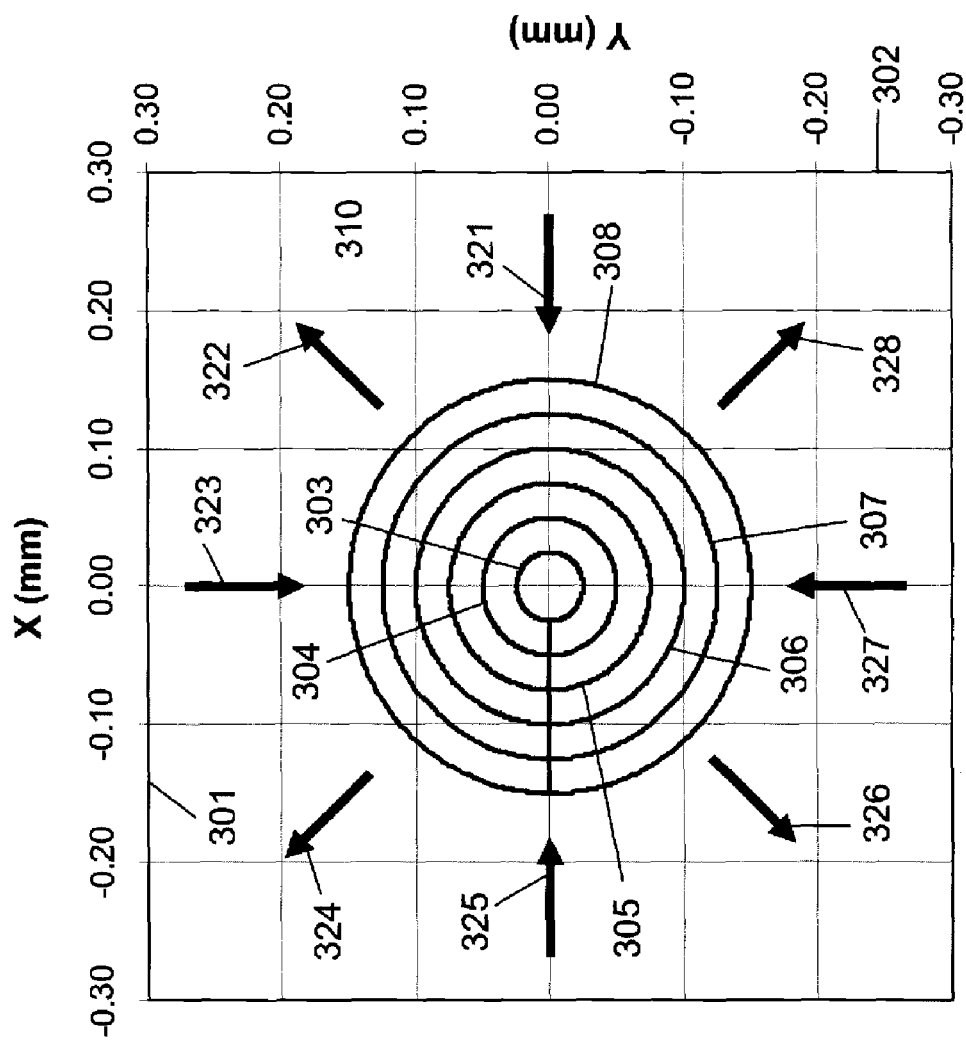
FIG. 9 shows the beam profile and force vectors induced by the quadrupole in a first embodiment of the present invention.

FIG. 9 shows the beam profile and force vectors induced by quadrupole 203 in a first embodiment of the present invention, corresponding to the case where KA<0 and B=0 in the formulas for δX and δY above. The beam profile is shown as a group of concentric circles 303-308 centered on the optical axis (X=Y=0). The X-axis 301 and the Y-axis 302 are shown in units of mm, with a maximum beam radius of 150 μm. The polarities of arrows 321-328 correspond to the 0° columns in Tables I and II. For a 45° orientation of the shaped beam, the directions of arrows 321-328 would be reversed as shown in the 45° columns in Tables I and II.

TABLE I

Figure 27:
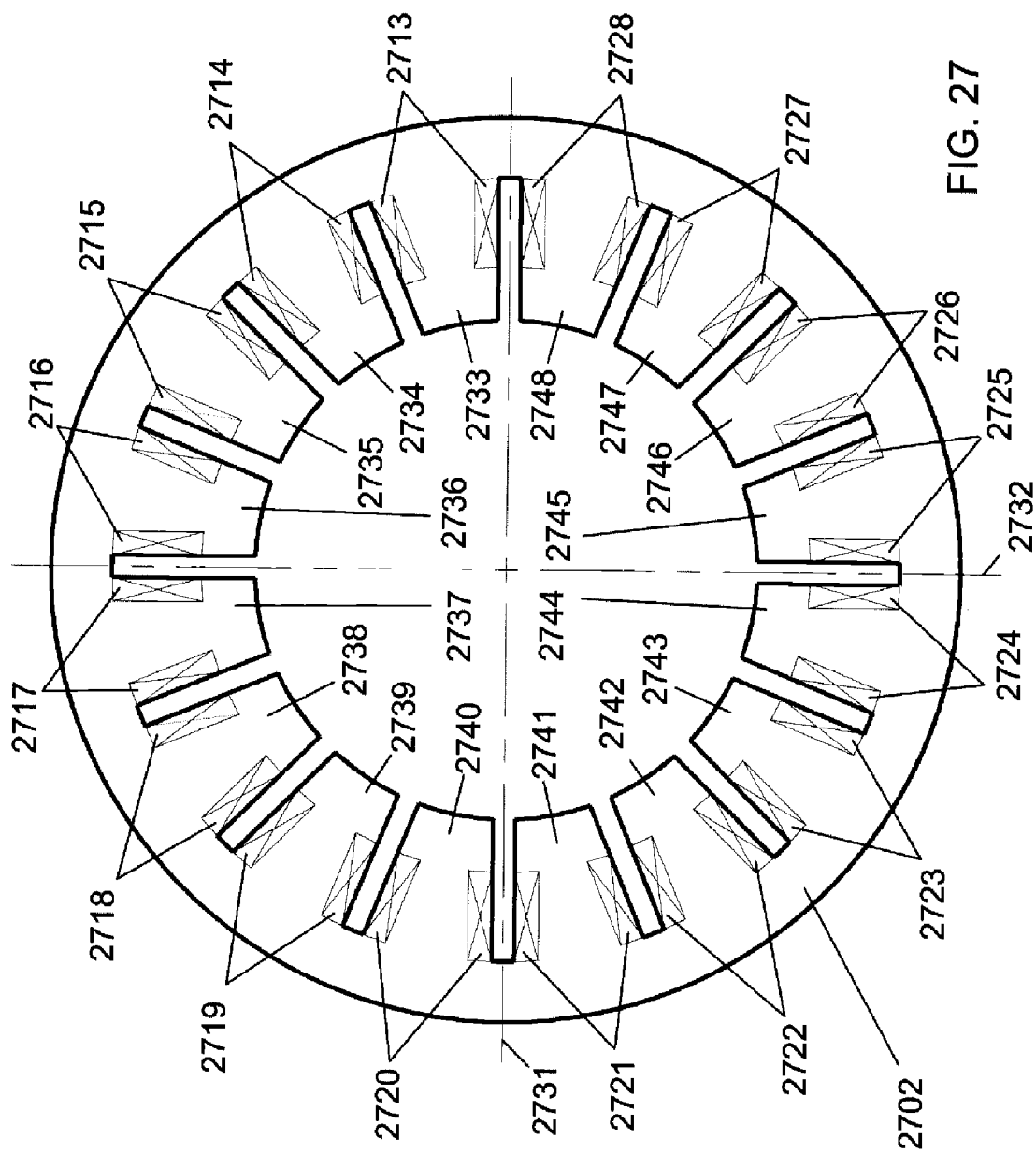
FIG. 27 shows a schematic view of a magnetic 16-pole optical element as used in first and second embodiments of the present invention.

Octupole excitation strengths and polarities for generating square beams in four orientations relative to the X- and Y-axes: 0°, 22.5°, 45°, and 67.5°, with the 16-pole octupole implementation in FIG. 7 or FIG. 27. At these four angles, the excitation strengths on the sixteen poles 233-248 are the same. Orientations at other angles between 0° and 90° are possible if the excitation strengths are not the same, as is familiar to those skilled in the art. Angles ≧90° are equivalent to angles between 0° and 90° since the excitation has four-fold symmetry.

| | Orientation of Square Beam | | | |
|---|---|---|---|---|
| Pole # | 0 deg | 22.5 deg | 45 deg | 67.5 deg |
| 233 | − | − | + | + |
| 234 | + | − | − | + |
| 235 | + | + | − | − |
| 236 | − | + | + | − |
| 237 | − | − | + | + |
| 238 | + | − | − | + |
| 239 | + | + | − | − |
| 240 | − | + | + | − |
| 241 | − | − | + | + |
| 242 | + | − | − | + |
| 243 | + | + | − | − |
| 244 | − | + | + | − |
| 245 | − | − | + | + |
| 246 | + | − | − | + |
| 247 | + | + | − | − |
| 248 | − | + | + | − |

TABLE II

Figure 28:
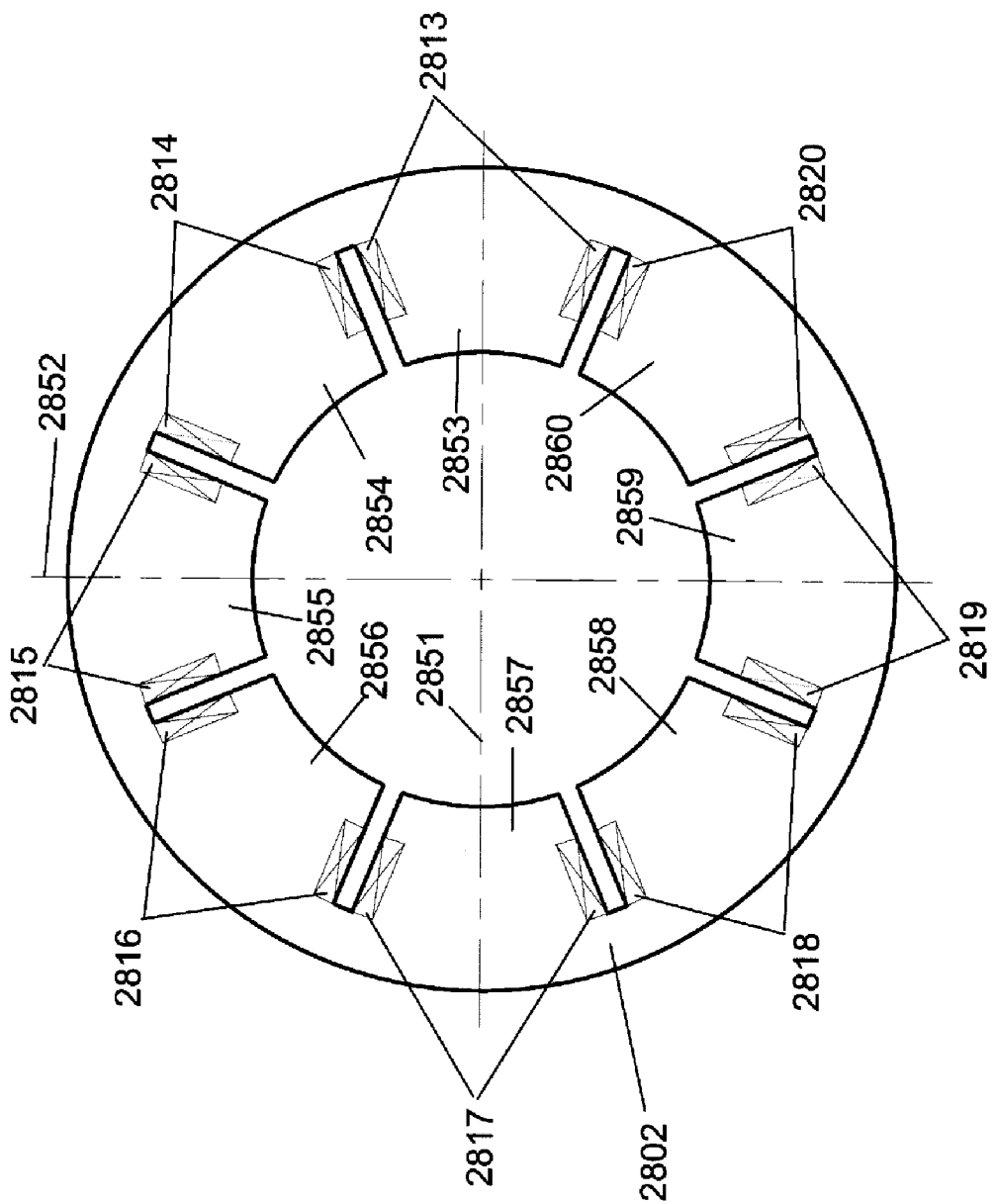
FIG. 28 shows a schematic view of a magnetic 8-pole optical element as used in first and second embodiments of the present invention.

Octupole excitation strengths and polarities for generating a square beam in two orientations relative to the X- and Y-axes: 0° and 45° with the 8-pole implementation in FIG. 8 or FIG. 28. At these two angles, the excitation strengths on the eight poles 253-260 are the same. Orientations at other angles are not possible with an 8-pole configuration. Angles ≧90° are equivalent to angles between 0° and 90° since the excitation has four-fold symmetry.

| | Orientation of Square Beam | |
|---|---|---|
| Pole # | 0 deg | 45 deg |
| 253 | − | + |
| 254 | + | − |
| 255 | − | + |
| 256 | + | − |
| 257 | − | + |
| 258 | + | − |
| 259 | − | + |
| 260 | + | − |

TABLE III

A comparison of the relative advantages and disadvantages of the two alternative implementations of an octupole element as shown in FIGS. 7 or 27 compared with FIGS. 8 or 28.

| Octupole Implementation | Advantages | Disadvantages |
|---|---|---|
| 16-pole (FIG. 7 & 27) | capability for beam shape orientation at any angle | increased complexity, more wires, more electronics |

TABLE III-continued

A comparison of the relative advantages and disadvantages of
the two alternative implementations of an octupole element as shown in
FIGS. 7 or 27 compared with FIGS. 8 or 28.

| Octupole Implementation | Advantages | Disadvantages |
|---|---|---|
| 8-pole (FIG. 8 & 28) | simpler - fewer wires and less electronics | beam can only be oriented at 0 and 45 deg |

FIGS. 7 or 27 compared with FIGS. 8 or 28.

Figure 10:
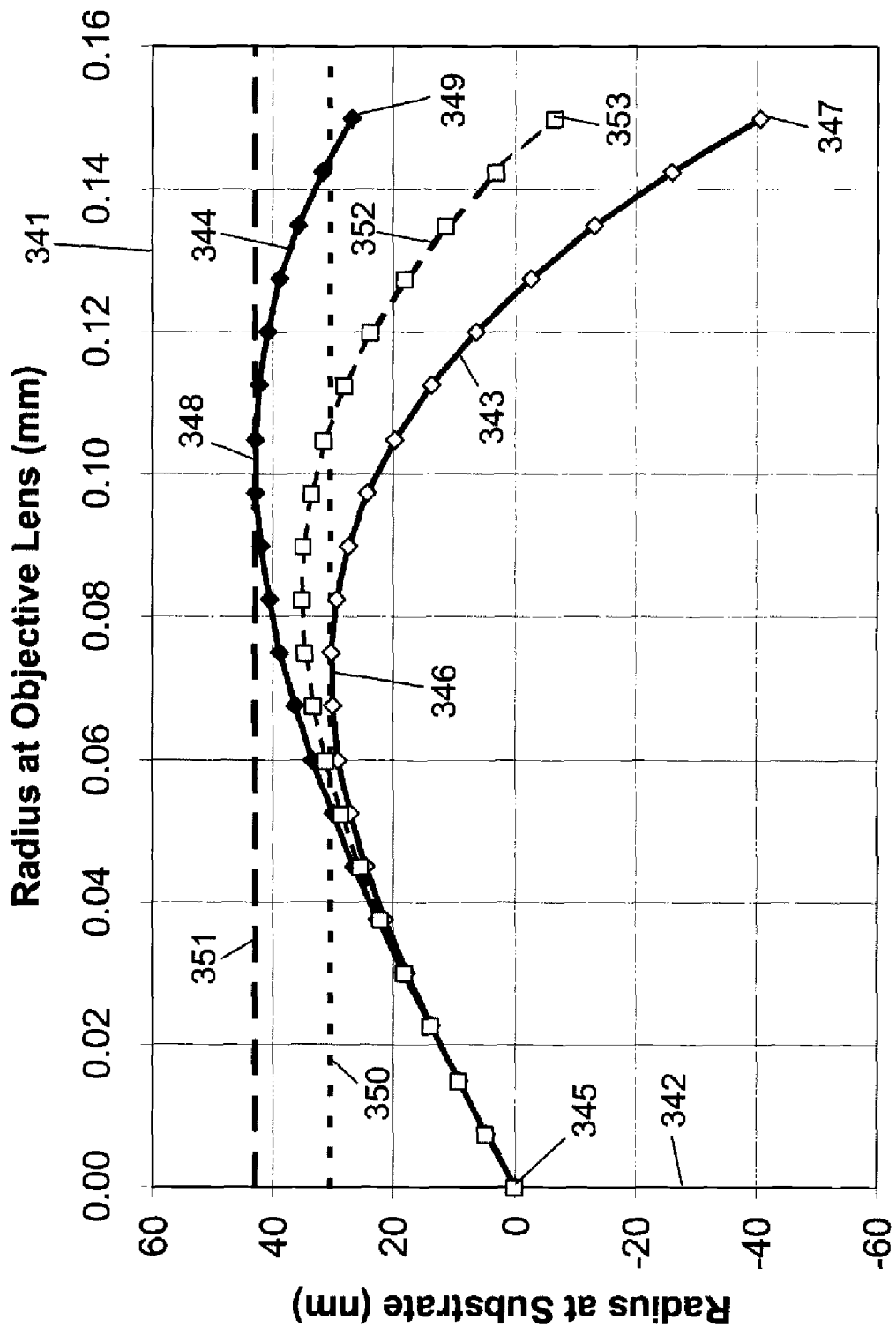
FIG. 10 shows a graph of the radii of the electron trajectories at the substrate surface against the radii of the trajectories at the objective lens in a first embodiment of the present invention.

FIG. 10 shows a graph of the radii 342 of the electron trajectories at the substrate surface 205 against the radii 341 of the trajectories at the objective lens 204 in a first embodiment of the present invention. Comparison of FIG. 10 with FIG. 4 for a two-lens circular beam column shows that now there are two curves, 343 and 344, instead of only one (e.g., curve 153 in FIG. 4)—this is because the beam is shaped into a square by azimuthal control of the total spherical aberration, as described below. In this example, the goal is to generate a square-shaped beam with 61 nm sides, where the sides of the square-shaped beam are aligned with the X-axis 361 or Y-axis 362 in FIG. 11. Thus the distance from the center of the beam to the side is 30.5 nm (short-dashed line 350) and the distance to the corners is $\sqrt{2}$ (30.5 nm)≈43.1 nm (long-dashed line 351). By use of octupole element 203, the total deflection of the beam now has the combined effects of three terms: a) defocus, b) spherical aberration in lens 204 (equivalent to lens 103 in FIGS. 1A-B), and c) the deflection due to octupole 203 (assuming B=0):

$$\delta X = (\Delta f/f)x - C_s x(x^2+y^2) + KA(4x^3 - 12xy^2)$$

$$\delta Y = (\Delta f/f)y - C_s y(x^2+y^2) + KA(-12x^2y + 4y^3)$$

The terms in these equations can be rearranged:

$$\delta X = (\Delta f/f)x + (4KA - C_s)x^3 - (12KA + C_s)xy^2$$

$$\delta Y = (\Delta f/f)y - (12KA + C_s)x^2y + (4KA - C_s)y^3$$

If K A <0, since $C_s$>0, then the on-axis terms (i.e., terms with $x^3$ and $y^3$) are increased, while the off-axis terms (i.e., terms with x $y^2$ and $x^2$ y) are decreased. Curve 352 is equivalent to curve 153 in FIG. 4, corresponding to azimuthally-uniform spherical aberration. Note that the end point 353 of curve 352 is midway between the endpoint 349 of curve 344 and the endpoint 347 of curve 343—this shows the effects of adding the octupole beam deflection due to element 203. By proper choice of defocus $\Delta f$, combined with the value of A, it is possible to bring the tangent point 348 of curve 344 to match the required radius 351 of the shaped beam corner at (43.1 nm). At the same time, the tangent point 346 of curve 343 is matching the required radius 350 of the shaped beam sides (at 30.5 nm). All three curves 343, 344, and 352 start at point 345 on axis 342 (i.e., at 0 nm radius at the substrate and at 0.00 mm radius at the objective lens 204).

Figure 11:
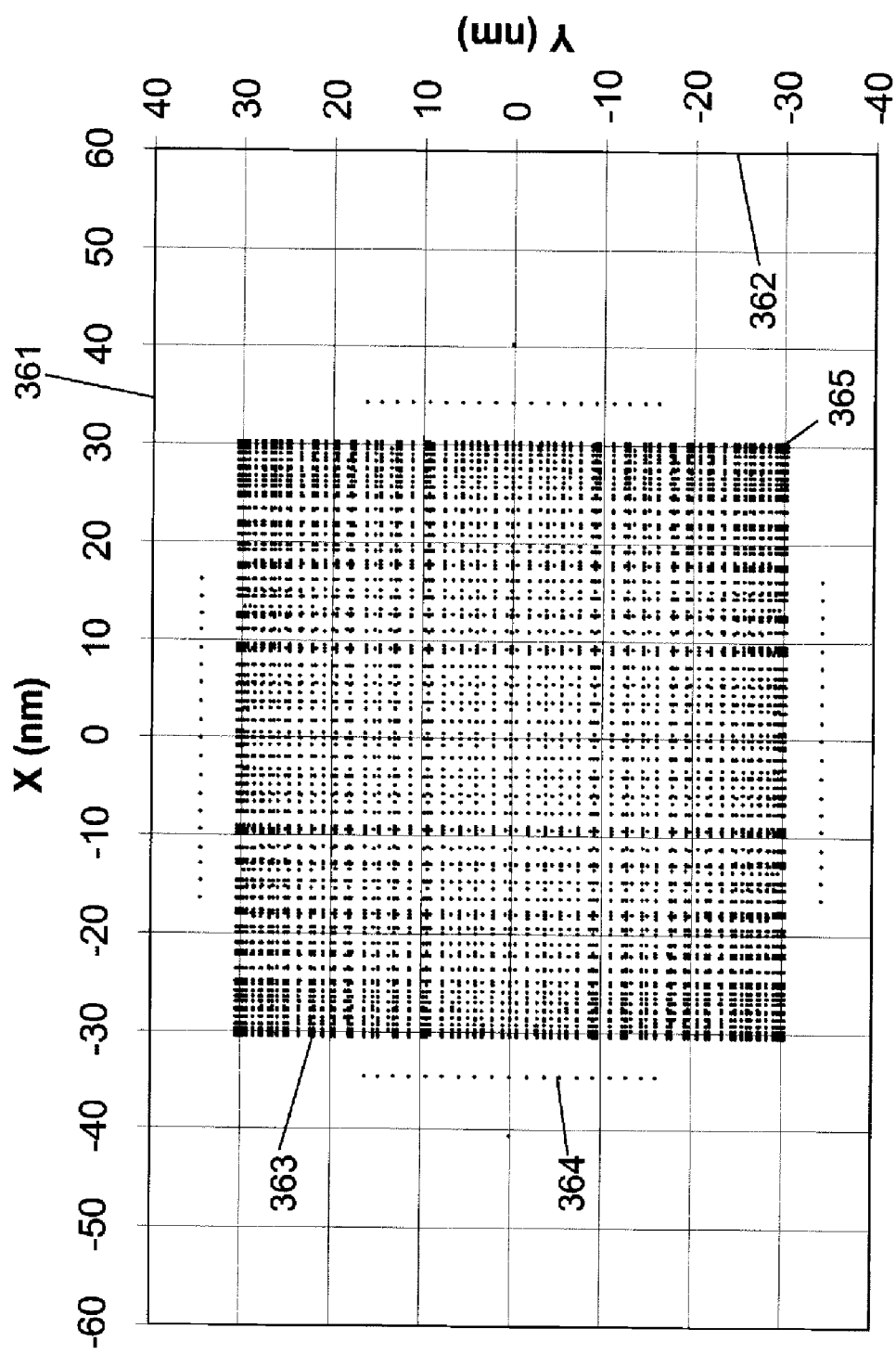
FIG. 11 shows a graph of beams transmitted to the substrate surface in a first embodiment of the present invention.

FIG. 11 shows a graph of the trajectories 363 along the X-axis 361 and Y-axis 362 at the substrate 205 (see FIG. 6) with the use of the first embodiment of the present invention to shape the beam into a square, instead of the round beam 163 shown in FIG. 5, which would result if the octupole element 203 were inactivated (i.e., if all the poles 233-248 in FIG. 7, or all of the poles 253-260 in FIG. 8 were set to the same voltage). The sharpness of corners 365 can be controlled by adjusting the strength of octupole element 203 (i.e., adjusting the value of constant A). Curves 343 and 344 in FIG. 10 show that there is substantial overlap of the trajectories 363 in FIG. 11—this overlap can be seen from the fact that both curves 343 and 344 show two different radii at the objective lens 204 (axis 342) for the same radius at substrate 205 (axis 341) in many cases. This overlap corresponds to a "folding over" of the beam on itself, thus making the beam smaller for a given number of trajectories reaching the substrate 205. Since the number of trajectories is proportional to the total beam current, this means that the beam current density at the substrate 205 is increased compared with the case of first-order imaging (the conventional method of beam-shaping) in which there is no folding over of the trajectories at the substrate.

If A is set=0, and B≠0, then a square rotated 45° to that shown in FIG. 11 would result. Note that because endpoint 347 has a larger magnitude of radius than line 350, a small number of trajectories 364 strike the substrate 205 outside the desired 61 nm square shape. This has only a minor effect since only a very small number of trajectories are in this group. The second embodiment of the present invention reduces or eliminates this effect.

Second Embodiment

FIGS. 12A-21 illustrate a second embodiment of the present invention. Table IV shows a comparison of the relative advantages and disadvantages of the first and second embodiments of the present invention. The second embodiment utilizes four elements 1203-1206, as shown in FIGS. 12A-B between the gun lens 1202 and the objective lens 1207. Elements 1203-1206 may be implemented using either 16-poles as in FIG. 7, or 8-poles as in FIG. 8.

Figure 13A:
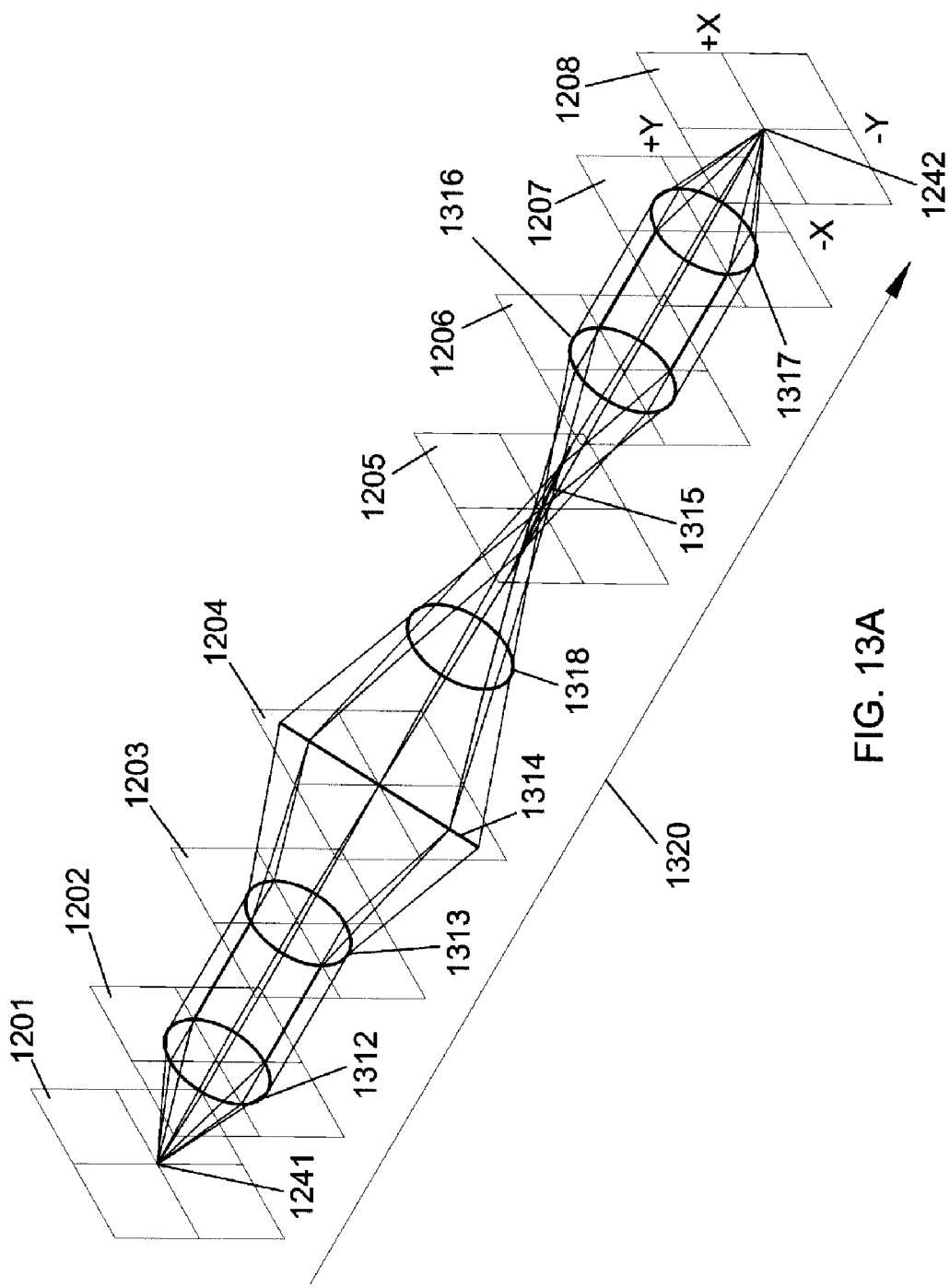
FIG. 13A shows a schematic isometric view of a second embodiment of the present invention, viewed in a direction approximately perpendicular to the +X+Y plane in FIG. 12A.

FIG. 12A shows a schematic side view of a second embodiment of the present invention in a plane containing two lines: a) a line midway between the +X-axis and +Y-axis, and b) the Z-axis=the optical axis–hereinafter this plane will be referred to as the (+X+Y)–Z plane. FIG. 12B shows a schematic side view of a second embodiment of the present invention in a plane containing two lines: a) a line between the –X-axis and +Y-axis, and b) the Z-axis=the optical axis–hereinafter this plane will be referred to as the (–X+Y)–Z plane. Note that this plane is perpendicular to the (+X+Y)–Z plane of FIG. 12A. FIG. 13A shows a schematic isometric view of a second embodiment of the present invention, viewed in a direction approximately perpendicular to the +X+Y plane in FIG. 12A.

Figure 13B:
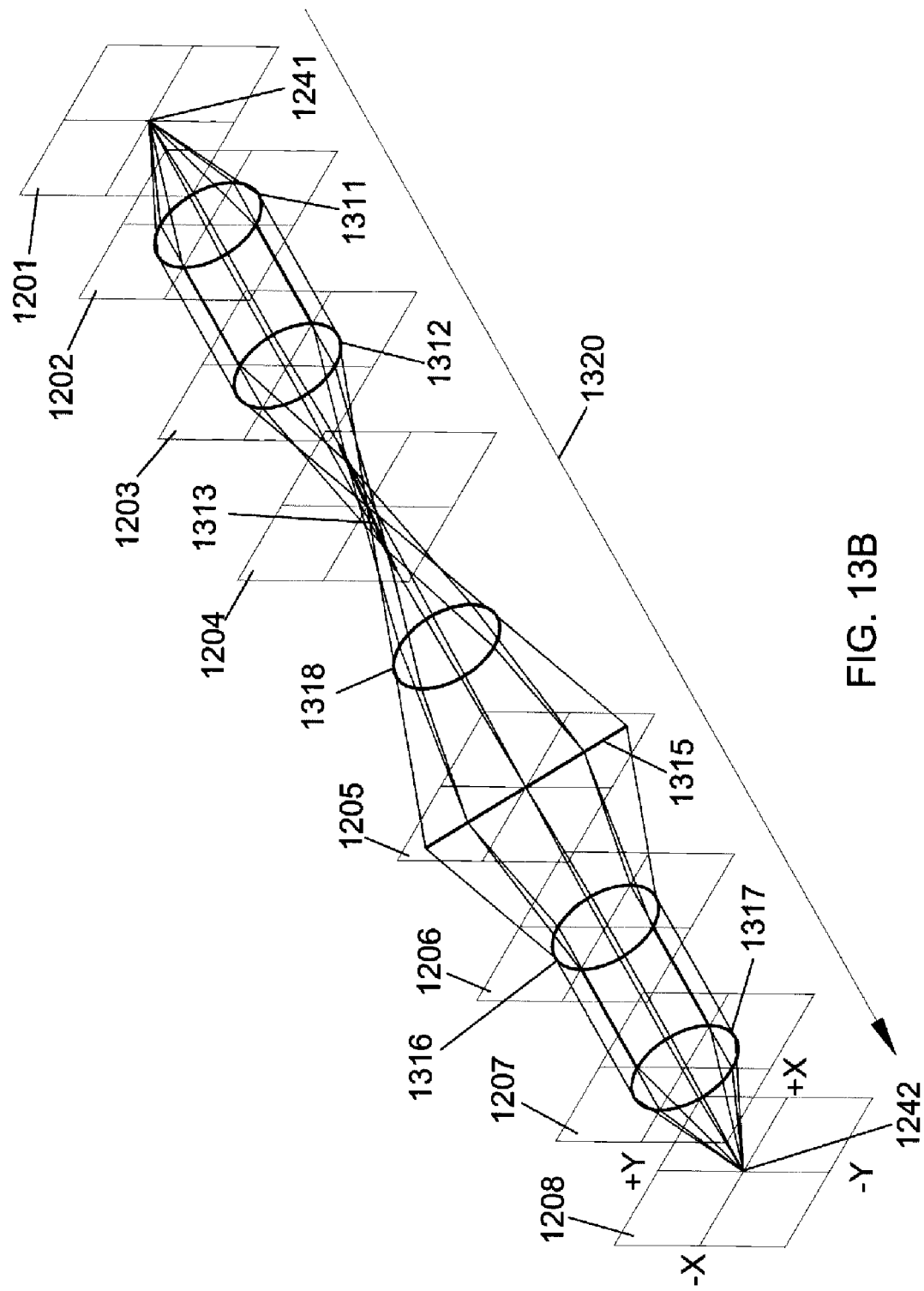
FIG. 13B shows a schematic isometric view of a second embodiment of the present invention in a direction 90° away from the viewing direction for FIG. 12A (the viewing direction is approximately perpendicular to the −X+Y plane in FIG. 12B).
Figure 14:
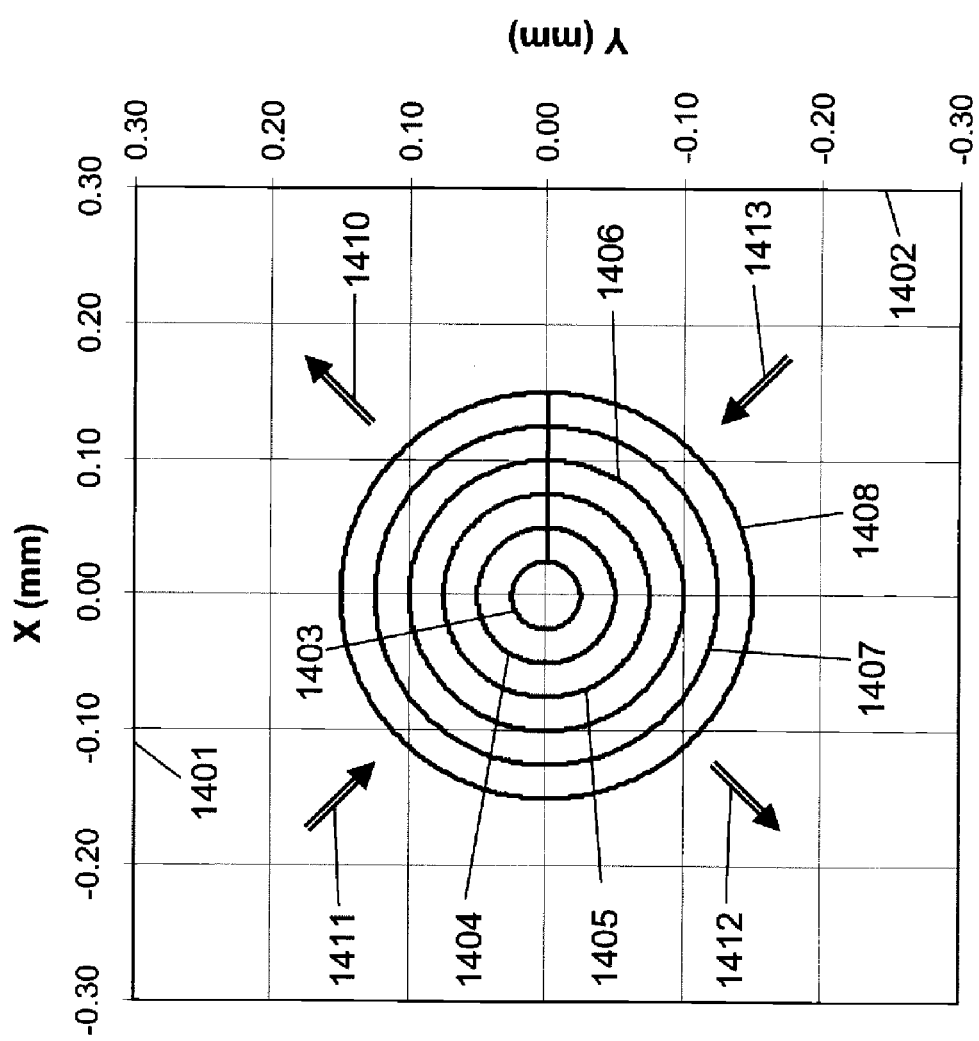
FIG. 14 shows the beam profile and force vectors at Quadrupole #1 in a second embodiment of the present invention.

FIG. 13B shows a schematic isometric view of a second embodiment of the present invention in a direction 90° away from the viewing direction for FIG. 13A (the viewing direction is approximately perpendicular to the –X+Y plane in FIG. 12B). The following discussion refers to all of FIGS. 12A-13B. Electrons 1221 and 1231 are emitted from electron source 1241 in object plane 1201, which can be a thermionic source, a $LaB_6$ emitter, a cold field emitter, a Schottky emitter, or other type of electron source as is familiar to those skilled in the art. The particular type of electron source is not part of the present invention. Gun lens 1202 (with focal length 1211) focuses electrons 1221 and 1231 into approximately parallel electron beams 1222 and 1232, respectively, of diameter 1312 which pass down the column a distance 1212 to reach quadrupole #1 1203 at a diameter 1313. In the (+X+Y)–Z plane (FIG. 12A), quadrupole #1 1203 is a diverging lens, while in the (–X+Y)–Z plane (FIG. 12B), quadrupole #1 1203 is a converging lens. The focal length of quadrupole #1 1203 is set equal to the distance 1213 between optical elements 1203 and 1204. Thus, in the (–X+Y)–Z plane (FIG. 12B), beam 1233 is brought to a focus at the center of quadrupole/octupole #2 1204. In the (+X+Y)–Z plane (FIG. 12A), beam 1223 is twice as far off-axis at quadrupole/octupole #2 1204 as at quadrupole #1 1203. The effect of quadrupole #1 1203 on beams 1222 and 1232 is shown in FIG. 14.

Due to the focusing effects of quadrupole #1 1203, the beam profile at quadrupole/octupole #2 1204 is a line 1314

Figure 15:
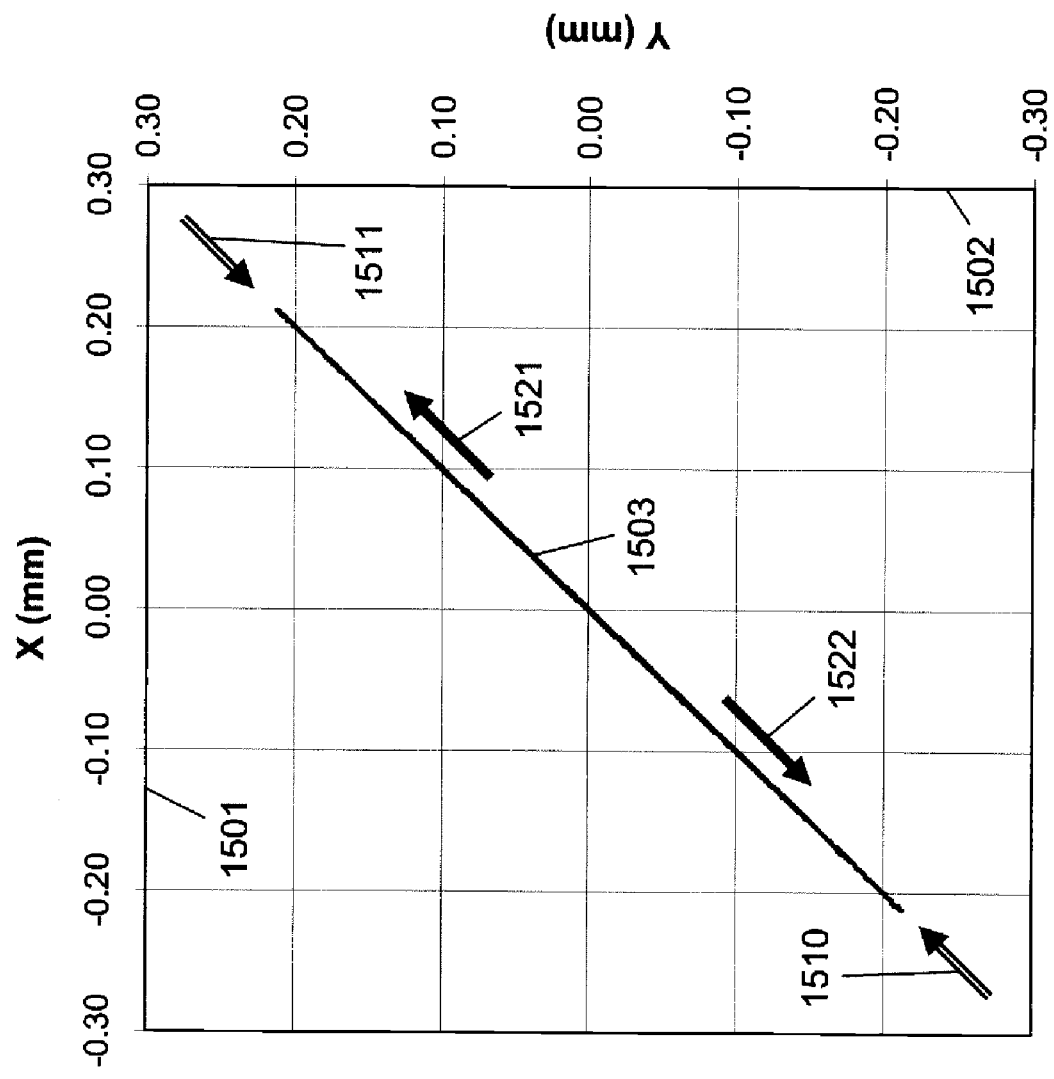
FIG. 15 shows the beam profile and force vectors at Quadrupole/Octupole #2 in a second embodiment of the present invention.

(seen most clearly in FIG. 13A) that is twice as long as beam diameter 1313. The effect of quadrupole/octupole #2 1204 on beams 1223 and 1233 is shown in FIG. 15. Because in the (−X+Y)−Z plane the beam is on-axis, there is no focusing effect due to quadrupole/octupole #2 1204. In the (+X+Y)−Z plane, the beam 1223 is strongly focused towards optical axis 1240, generating converging beam 1224. In the (−X+Y)−Z plane, the beam 1234 diverges away from optical axis 1240.

In the example shown here, the relationships between the spacings of elements 1203-1206 are as follows:

Spacing 1214=2 (spacing 1213)=2 (spacing 1215)

Spacing 1211 is the focal length of gun lens 1202, while spacing 1217 is approximately the focal length of objective lens 1207. As long as the beam is assumed parallel after lens 1202, spacing 1212 is unimportant. As long as the beam is parallel after quadrupole/octupole #4 1206, spacing 1216 is also unimportant. Midway between quadrupole/octupole #2 1204 and quadrupole/octupole #3 1205, the beam is circular with a diameter 1318.

Figure 16:
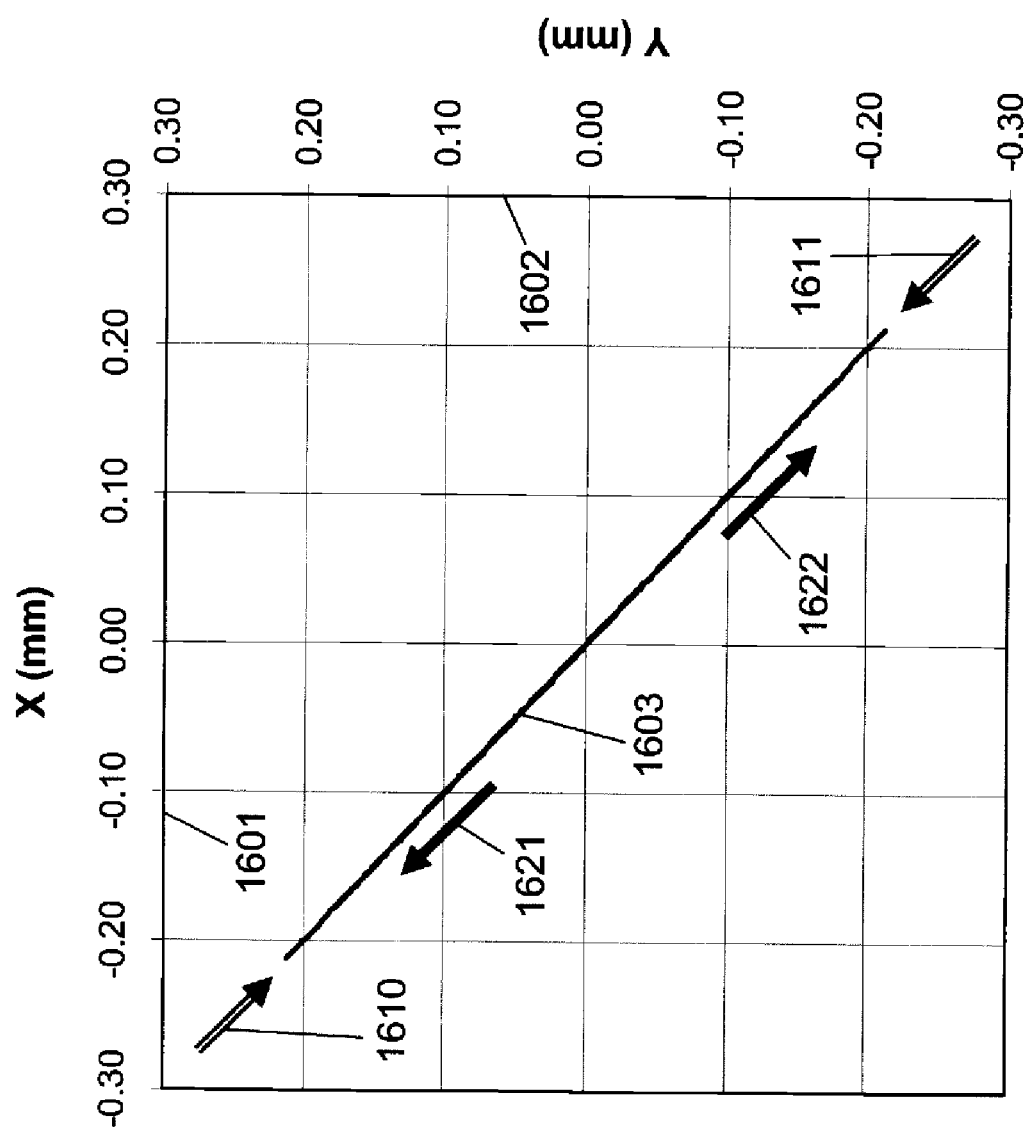
FIG. 16 shows the beam profile and force vectors at Quadrupole/Octupole #3 in a second embodiment of the present invention.

Due to the focusing effects of quadrupole/octupole #2 1204, the beam profile at quadrupole/octupole #3 1205 is a line 1315 (seen most clearly in FIG. 13B) that is equal in length to line 1314, but rotated 90° azimuthally. The effect of quadrupole/octupole #3 1205 on beams 1224 and 1234 is shown in FIG. 16. Because in the (+X+Y)−Z plane (FIG. 12A) the beam is on-axis, there is no focusing effect due to quadrupole/octupole #3 1205 and the beam 1225 diverges away from optical axis 1240. In the (−X+Y)−Z plane (FIG. 12B), the beam 1234 is strongly focused towards optical axis 1240, generating converging beam 1235.

Figure 17:
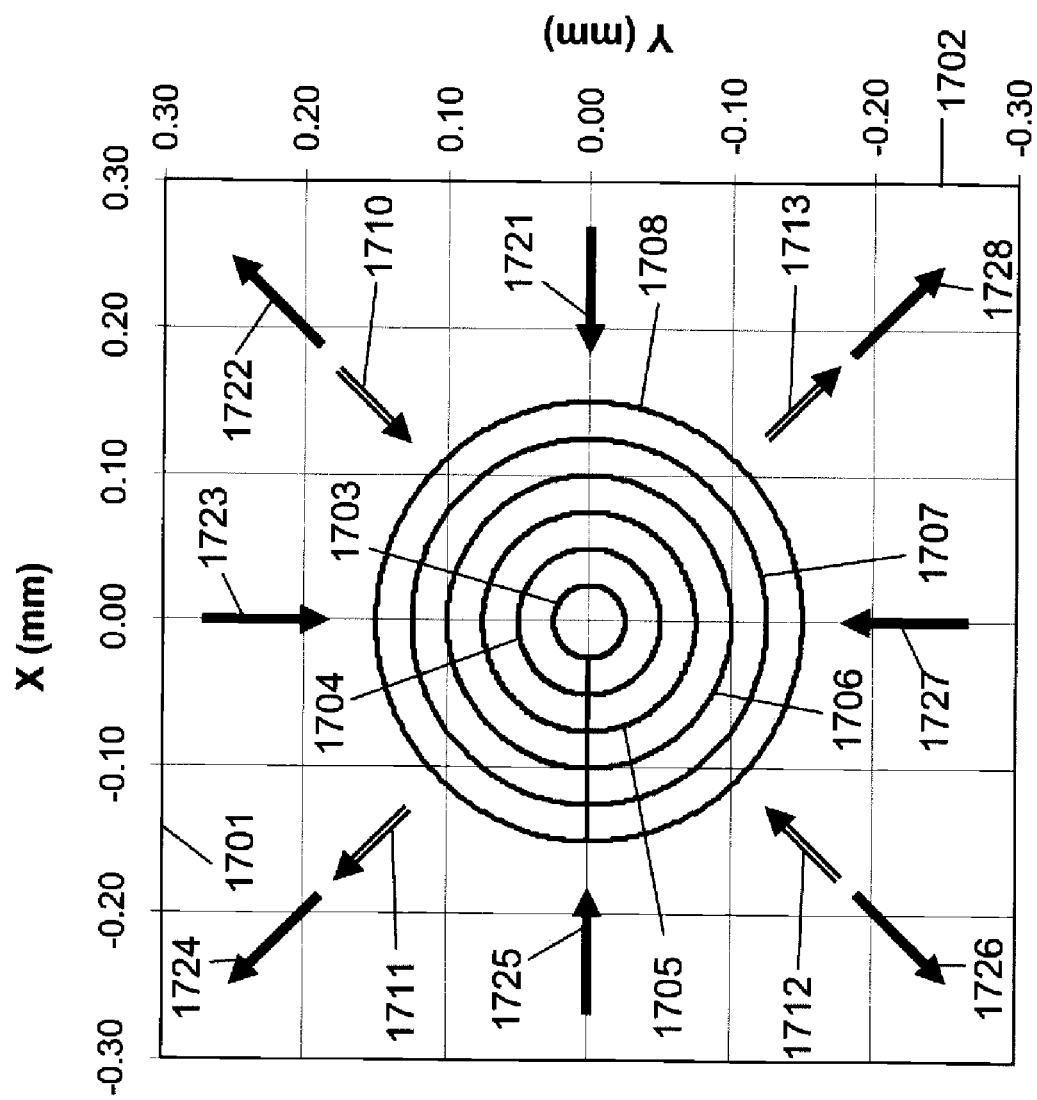
FIG. 17 shows the beam profile and force vectors at Quadrupole/Octupole #4 in a second embodiment of the present invention.

Due to the focusing effects of quadrupole/octupole #3 1205, the beam profile at quadrupole/octupole #4 1206 is a circle 1316. The effect of quadrupole/octupole #4 1206 on beams 1225 and 1235 is shown in FIG. 17. Because in both the (+X+Y)−Z and (−X+Y)−Z planes the beam is off-axis, there is a lens effect for all positions on the beam diameter 1316. In the (+X+Y)−Z plane (FIG. 12A), beam 1225 is focused towards optical axis 1240, generating parallel beam 1226. In the (−X+Y)−Z plane (FIG. 12B), the beam 1235 is focused away from optical axis 1240, generating parallel beam 1236. The parallel beams 1226 and 1236 reach objective lens 1207 on circle 1317, where all electrons are focused towards the substrate 1208 at point 1242.

In the preceding discussion, only the first-order focusing effects of elements 1203-1206 have been discussed—these are the optical effects of the quadrupole excitations of elements 1203-1206. In order to shape the beam, however, it is necessary to add octupole excitations to elements 1204-1206, as will be described in FIGS. 15-17.

TABLE IV

Comparison of the advantages and disadvantages of the first and second embodiments of the present invention.

| Embodiment | Advantages | Diasadvantages |
|---|---|---|
| First | simpler - no added components, only addition of octupole excitation to existing deflectors (8N-poles) | some rays outside square, less ability to fine-tune corner rounding |
| Second | no rays outside square, ability to fine-turn corner rounding | more complex - need to add some 8N-pole elements to column design, added wires and electronics |

FIG. 14 shows the beam profile and force vectors induced by Quadrupole #1 1203 in a second embodiment of the present invention. The beam profile is shown as a group of concentric circles 1403-1408 centered on the optical axis (X=Y=0). A pure quadrupole element (i.e., an element not also having dipole, hexapole, octupole, or other non-quadrupole excitations) is characterized by an electrostatic potential, V(x,y):

$$V(x,y)=C(x^2-y^2)+D2xy$$

where C and D are constants, and x and y are the beam coordinates at the quadrupole element. Since the deflection of the electron trajectories passing through the quadrupole is proportional to the electric field, $E(x,y)=-\nabla V(x,y)$, the beam deflections at the next element (e.g., at element 1204 due to deflection by element 1203, etc.), $\delta X_o$, and $\delta Y_o$, are:

$$\delta X_o = Q\partial V(x,y)/\partial x = QC2x+QD2y$$

$$\delta Y_o = Q\partial V(x,y)/\partial y = -QC2y+QD2x$$

where Q is a constant that depends on the beam energy passing through the quadrupole and the length and bore of the quadrupole poles. The constant C corresponds to a quadrupole oriented along the X- and Y-axes, while the constant D corresponds to an quadrupole oriented 45° relative to the X- and Y-axes. In the following discussion, C=0, corresponding to the requirement to generate line foci 1314 and 1315 oriented 45° relative to the X- and Y-axes. For complete generality (i.e., arbitrary orientations of the shaped beam), both C and D would be non-zero. Use of quadrupoles to shape beams down an electron beam column is familiar to those skilled in the art.

The beam profile at quadrupole #1 1203 is shown as a group of concentric circles 1403-1408 centered on the optical axis (X=Y=0). The X-axis 1401 and the Y-axis 1402 are shown in units of mm, with a maximum beam radius of 150 μm. The four double arrows 1410-1413 represent forces on the beam due to the quadrupole excitation as shown in the columns for 45° in Table V (for the 16-pole in FIG. 7 or FIG. 27) and Table VI (for the 8-pole in FIG. 8 or FIG. 28).

FIG. 15 shows the beam profile and force vectors induced by Quadrupole/Octupole #2 1204 in a second embodiment of the present invention. The X-axis 1501 and the Y-axis 1502 are shown in units of mm, with a maximum beam distance off-axis of 300 μm, or twice the 150 μm radius in FIG. 14, as described in FIGS. 12A-13B, above. The two double arrows 1510 and 1511 show the first-order converging effects of the quadrupole excitation of quadrupole/octupole #2 1204. The two single arrows 1521 and 1522 show the third-order diverging effects of the octupole excitation of quadrupole/octupole #2 1204. Note that both the quadrupole and octupole effects act only along the (+X+Y)-axis where the beam has a non-zero radius since in all cases the beam deflection is a function of the beam radius. Quadrupole #1 1203 generates a line beam at quadrupole/octupole #2 1204 so that the octupole excitation of quadrupole/octupole #2 1204 can act on the beam only along the (+X+Y)−direction, thereby adjusting the sharpness of two diagonal corners of the final shaped beam at the substrate 1208.

TABLE V

Quadrupole excitation strengths and polarities for generating line beams in eight orientations relative to the X- and Y-axes: 0° to 157.5° in steps of 22.5°, with the 16-pole implementation in FIG. 7 or 27. Two people strength magnitudes are shown for these orientation angles: 1.000 and 0.414 = (√2 − 1). Orientations at other angles between 0° and 180° are possible with other pole strengths as is familiar to those skilled in the art. Angles ≧180° are equivalent to angles between 0° and 180° since the excitation has two-fold symmetry.

| | Orientation of Line Focus | | | | | | | |
|---|---|---|---|---|---|---|---|---|
| Pole # | 0.0 deg | 22.5 deg | 45.0 deg | 67.5 deg | 90.0 deg | 112.5 deg | 135.0 deg | 157.5 deg |
| 233 | + | + | +a | −a | − | − | −a | +a |
| 234 | +a | + | + | +a | −a | − | − | −a |
| 235 | −a | +a | + | + | +a | −a | − | − |
| 236 | − | −a | +a | + | + | +a | −a | − |
| 237 | − | − | −a | +a | + | + | +a | −a |
| 238 | −a | − | − | −a | +a | + | + | +a |
| 239 | +a | −a | − | − | −a | +a | + | + |
| 240 | + | +a | −a | − | − | −a | +a | + |
| 241 | + | + | +a | −a | − | − | −a | +a |
| 242 | +a | + | + | +a | −a | − | − | −a |
| 243 | −a | +a | + | + | +a | −a | − | − |
| 244 | − | −a | +a | + | + | +a | −a | − |
| 245 | − | − | −a | +a | + | + | +a | −a |
| 246 | −a | − | − | −a | +a | + | + | +a |
| 247 | +a | −a | − | − | −a | +a | + | + |
| 248 | + | +a | −a | − | − | −a | +a | + | a = cos(2 * 33.75 deg)/cos (2 * 11.25 deg) = 0.414

Table V. Quadrupole excitation strengths and polarities for generating line beams in eight orientations relative to the X- and Y-axes: 0° to 157.5° in steps of 22.5°, with the 16-pole implementation in FIG. 7 or 27. Two pole strength magnitudes are shown for these orientation angles: 1.000 and 0.414=(√2−1). Orientations at other angles between 0° and 180° are possible with other pole strengths as is familiar to those skilled in the art. Angles ≧180°are equivalent to angles between 0° and 180° since the excitation has two-fold symmetry.

TABLE VI

Quadrupole excitation strengths and polarities for generating line beams in four orientations relative to the X- and Y-axes: 0°, 45°, 90° and 135° with the 8-pole implementation in FIG. 8 or 28. At these four angles, the excitation strengths on the eight poles 253-260 are the same. Orientations at other angles are between 0° and 180° are not possible with an 8-pole implementation. Angles >180° are equivalent to angles between 0° and 180° since the excitation has two-fold symmetry.

| | Orientation of Line Focus | | | |
|---|---|---|---|---|
| Pole # | 0 deg | 45 deg | 90 deg | 135 deg |
| 253 | + | 0 | − | 0 |
| 254 | 0 | + | 0 | − |
| 255 | − | 0 | + | 0 |
| 256 | 0 | − | 0 | + |
| 257 | + | 0 | − | 0 |
| 258 | 0 | + | 0 | − |
| 259 | − | 0 | + | 0 |
| 260 | 0 | − | 0 | + |

Table VI. Quadrupole excitation strengths and polarities for generating line beams in four orientations relative to the X- and Y-axes: 0°, 45°, 90° and 135° with the 8-pole implementation in FIG. 8 or 28. At these four angles, the excitation strengths on the eight poles 253-260 are the same. Orientations at other angles between 0° and 180° are not possible with an 8-pole implementation. Angels >180° are equivalent to angles between 0° and 180° since the excitation has two-fold symmetry.

FIG. 16 shows the beam profile and force vectors induced by Quadrupole/Octupole #3 1205 in a second embodiment of the present invention. The X-axis 1601 and the Y-axis 1602 are shown in units of mm, with a maximum beam distance off-axis of 300 μm, or equal to the maximum beam distance off-axis in FIG. 15, as described in FIGS. 12A-13B, above. The two double arrows 1610 and 1611 show the first-order converging effects of the quadrupole excitation of quadrupole/octupole #3 1205. The two single arrows 1621 and 1622 show the third-order diverging effects of the octupole excitation of quadrupole/octupole #3 1205. Note that both the quadrupole and octupole effects act only along the (−X+Y)-axis where the beam has a non-zero radius since in all cases the beam deflection is a function of the beam radius. Intuitively, quadrupole/octupole #2 1204 generates a line beam at quadrupole/octupole #3 1205 so that the octupole excitation of quadrupole/octupole #3 1205 can act on the beam only along the (−X+Y)-direction, thereby adjusting the sharpness of two diagonal corners of the final shaped beam at the substrate 1208 (the two corners not adjusted by quadrupole/octupole #2 1204).

FIG. 17 shows the beam profile and force vectors induced by Quadrupole/Octupole #4 1206 in a second embodiment of the present invention. The beam profile is shown as a group of concentric circles 1703-1708 centered on the optical axis (X=Y=0). The X-axis 1701 and the Y-axis 1702 are shown in units of mm, with a maximum beam radius of 150 μm, equal to the radius in FIG. 14, as described in FIGS. 12A-13B, above. The four double arrows 1710-1713 show the first-order converging effects of the quadrupole excitation of quadrupole/octupole #4 1206. The eight single arrows 1721-1728 show the third-order converging and diverging effects of the octupole excitation of quadrupole/octupole #4 1206. Note that both the quadrupole and octupole effects act in all directions azimuthally since the beam has non-zero radius for all trajectories. Intuitively, quadrupole/octupole #3 1205 generates a circular beam at quadrupole/octupole #4 1206 so that the octupole excitation of quadrupole/octupole #3 1205 can act on the beam in all directions, in the same way that octupole 203 acts on the beam in the first embodiment. The combined effects of elements 1204-1206 is to shape the beam into a square, at the substrate 1208, but with increased adjustability of corner sharpness compared with the first embodiment due to the additional octupole excitations in elements 1204-1205 (see comparison in Table IV).

Figure 18:
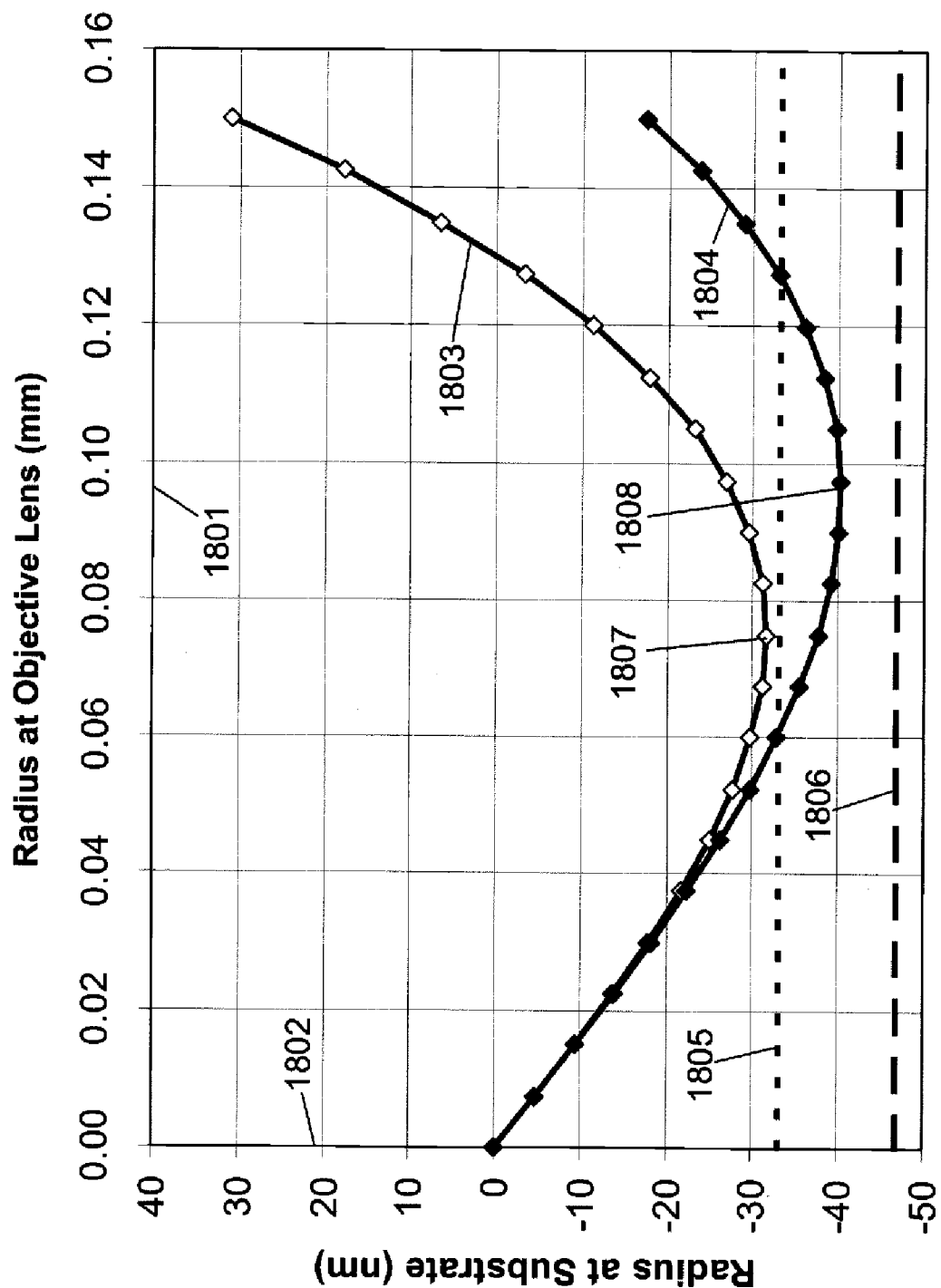
FIG. 18 shows a graph of the radii of the electron trajectories at the substrate surface against the radii of the trajectories at the objective lens in a second embodiment of the present invention with only Octupole #4 activated.

FIG. 18 shows a graph of the radii 1802 of the electron trajectories at the substrate surface 1802 against the radii 1801 of the trajectories at the objective lens in a second embodiment of the present invention, in which only quadrupole/octupole #4 1206 has an octupole excitation—this example is only for illustration, and basically corresponds to operating in a mode similar to the first embodiment. In this case, elements 1204 and 1205 function only as quadrupoles. Comparison of FIG. 18 with FIG. 4 for a circular beam column shows that now there are two curves, 1803 and 1804, instead of only one—this is because the beam is shaped into a square by azimuthal control of the spherical aberration, as described below. The goal is to generate a square-shaped beam with 66 nm sides. Thus the distance from the center of the beam to the side is 33 nm (short dashed line 1805) and the distance to the corners is √2 (33 nm)≈46.7 nm (long dashed line 1806). By use of quadrupole/octupole element 1206, the total deflection of the beam now has the combined effects of three terms, defocus, spherical aberration in lens 1207 (equivalent to lens 103 in FIGS. 1A-B), and the deflection due to quadrupole/octupole 1206, as was described above for the first embodiment. In FIG. 18, the octupole excitation of quadrupole/octupole 1206 has intentionally been set low to leave the corners of the beam in FIG. 19 rounded. In many applications where sidewall coverage during deposition is an issue, it is preferable not to generate a beam with sharp corners, since the resulting etched square hole (typically a contact or via) would be difficult or impossible to completely fill with conductive material (such as tungsten, copper, aluminum, etc.). Because of the corner rounding in FIG. 19, the minimum 1807 of curve 1803 does not quite reach the desired 33 nm beam radius of 1805 for the sides of the square beam. Similarly, the minimum 1808 of curve 1804 does not quite reach the desired 46.7 nm radius of 1805 for the corners of the square beam. Note that axis 1802 includes both positive and negative numbers for the radius at the substrate 1208—in this case, a negative radius corresponds to a positive radius of the same magnitude, but rotated azimuthally by 180° around the optical axis 1240.

Figure 19:
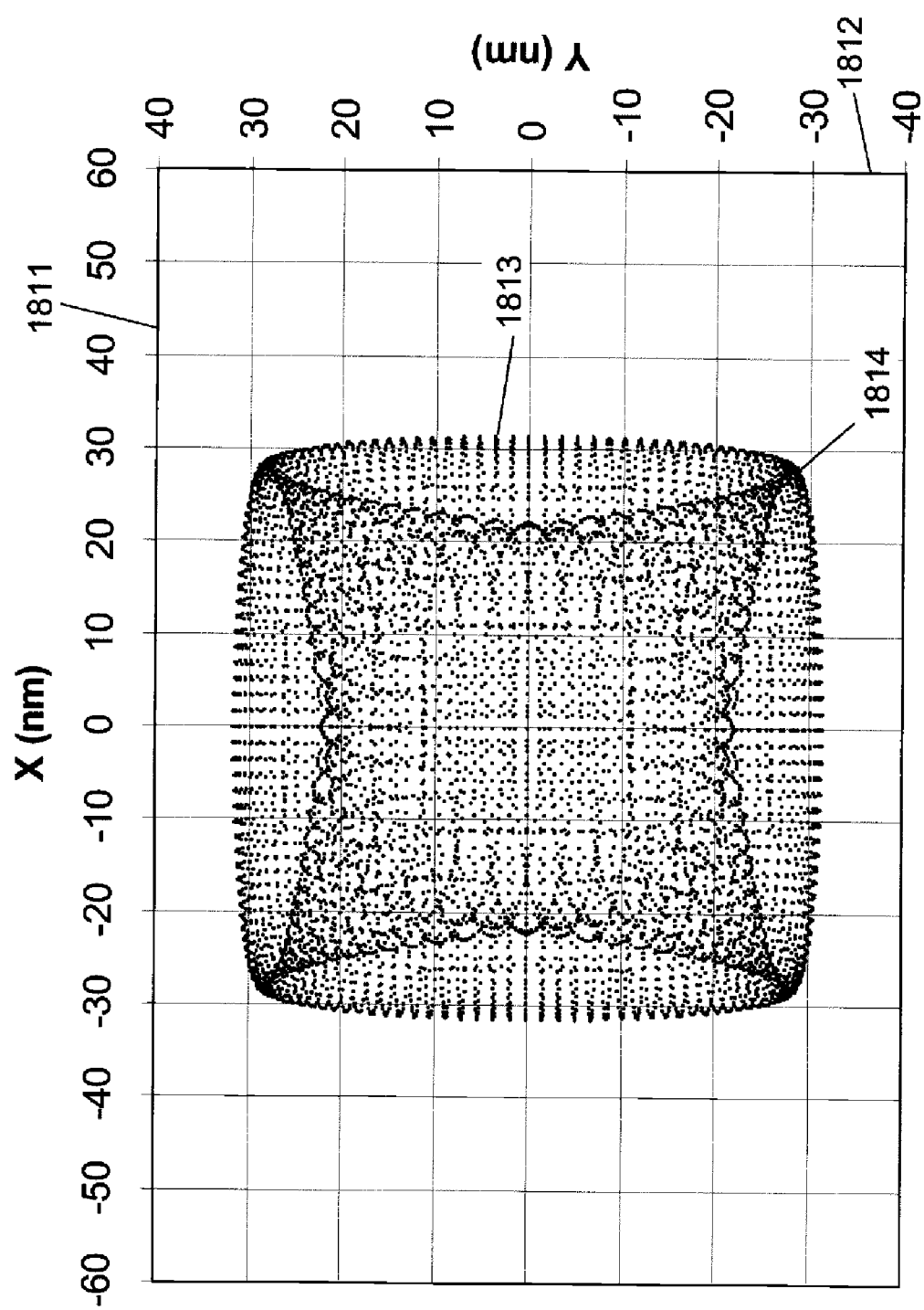
FIG. 19 shows a graph of beams transmitted to the substrate surface in a second embodiment of the present invention with only Octupole #4 activated.

FIG. 19 shows a graph of the trajectories 1813 along the X-axis 1811 and Y-axis 1812 at the substrate 1208 with the use of the second embodiment of the present invention to shape the beam into a square with rounded corners 1814 in which only quadrupole/octupole #4 1206 has an octupole excitation. As described in FIG. 18, in many applications, some rounding of the corners of the beam may be advantageous to improve sidewall coverage during deposition into the contact or via. Curves 1807 and 1808 in FIG. 18 show that there is substantial overlap of the trajectories 1813 in FIG. 19—this overlap can be seen from the fact that both curves 1807 and 1808 show two different radii at the objective lens 1207 (axis 1802) for the same radius at substrate 1208 (axis 1801) in many cases. This overlap corresponds to a "folding over" of the beam on itself, thus making the beam smaller for a given number of trajectories reaching the substrate 1207—this is the same phenomenon seen in FIGS. 10-11. Since the number of trajectories is proportional to the total beam current, this means that the beam current density at the substrate 1208 is increased compared with the case of first-order imaging (the conventional method of beam-shaping) in which there is no folding over of the trajectories at the substrate.

Figure 20:
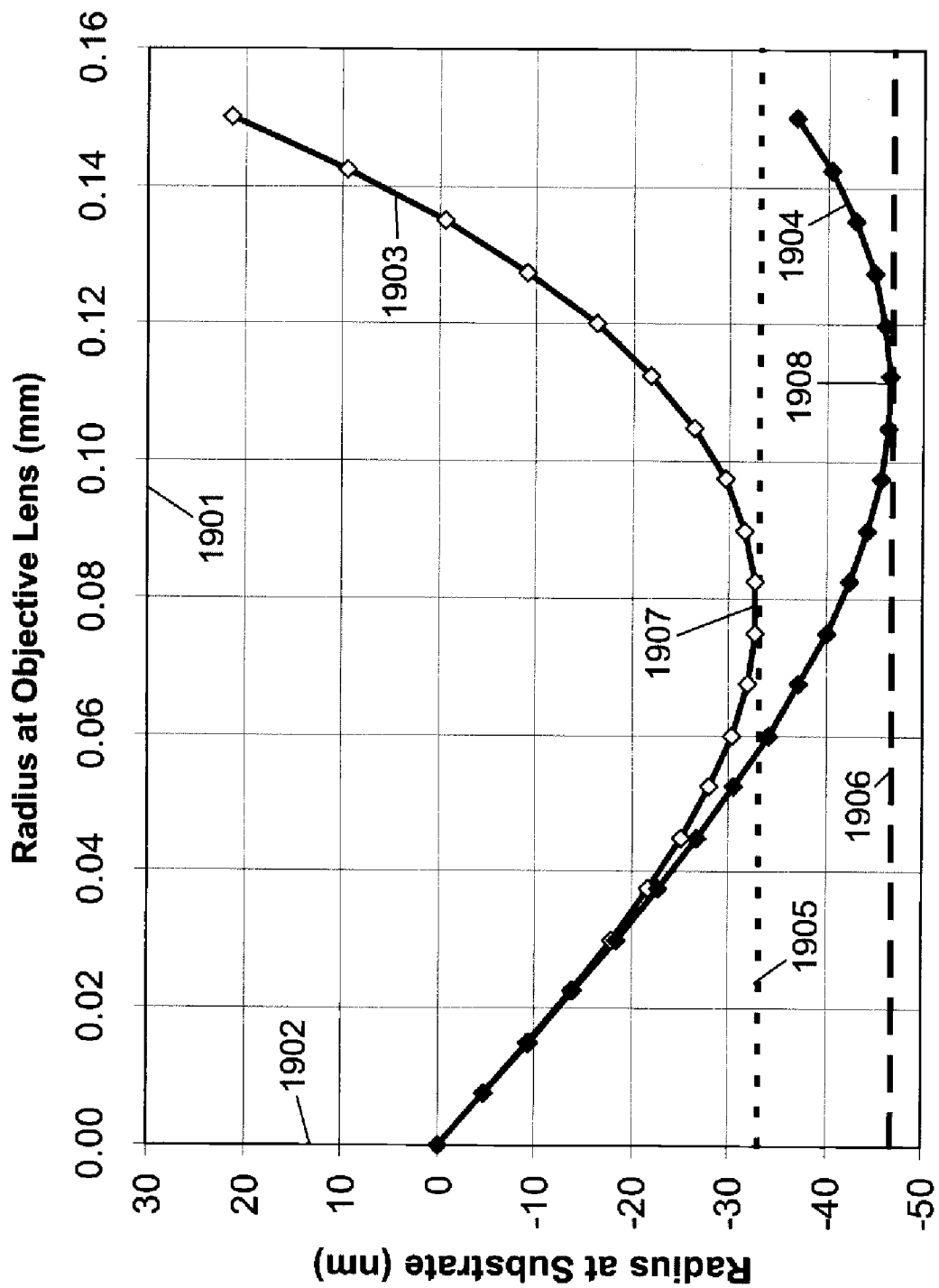
FIG. 20 shows a graph of the radii of the electron trajectories at the substrate surface against the radii of the trajectories at the objective lens in a second embodiment of the present invention with Octupoles #2-4 activated.

FIG. 20 shows a graph of the radii 1902 of the electron trajectories at the substrate 1208 against the radii 1901 of the trajectories at the objective lens in a second embodiment of the present invention, in which elements 1204-1206 all have octupole excitations as shown in FIGS. 15-17. Comparison of FIG. 19 with FIG. 4 for a circular beam column shows that now there are two curves, 1903 and 1904, instead of only one—this is because the beam is shaped into a square by azimuthal control of the total spherical aberration, as described below. The goal is to generate a square-shaped beam with 66 nm sides. Thus the distance from the center of the beam to the side is 33 nm (short dashed line 1905) and the distance to the corners is √2 (33 nm)≈46.7 nm (long dashed line 1906). By use of quadrupole/octupole elements 1204-1206, the total deflection of the beam now has the combined effects of three terms: defocus, spherical aberration in lens 1207 (equivalent to lens 103 in FIGS. 1A-B), and the deflection due to the octupole excitations in quadrupole/octupole elements 1204-1206. In FIG. 19, the effects of elements 1204-1207 have combined to generate the square beam in FIG. 21 which has no rays outside the desired square beam profile. The minimum 1907 of curve 1903 is tangent to the desired side radius 33 nm 1905. The minimum 1908 of curve 1904 is tangent to the desired corner radius 46.7 nm 1906. Note that axis 1902 includes both positive and negative numbers for the radius at the substrate 1208—in this case, a negative radius corresponds to a positive radius of the same magnitude, but rotated azimuthally by 180° around the optical axis 1240.

Figure 21:
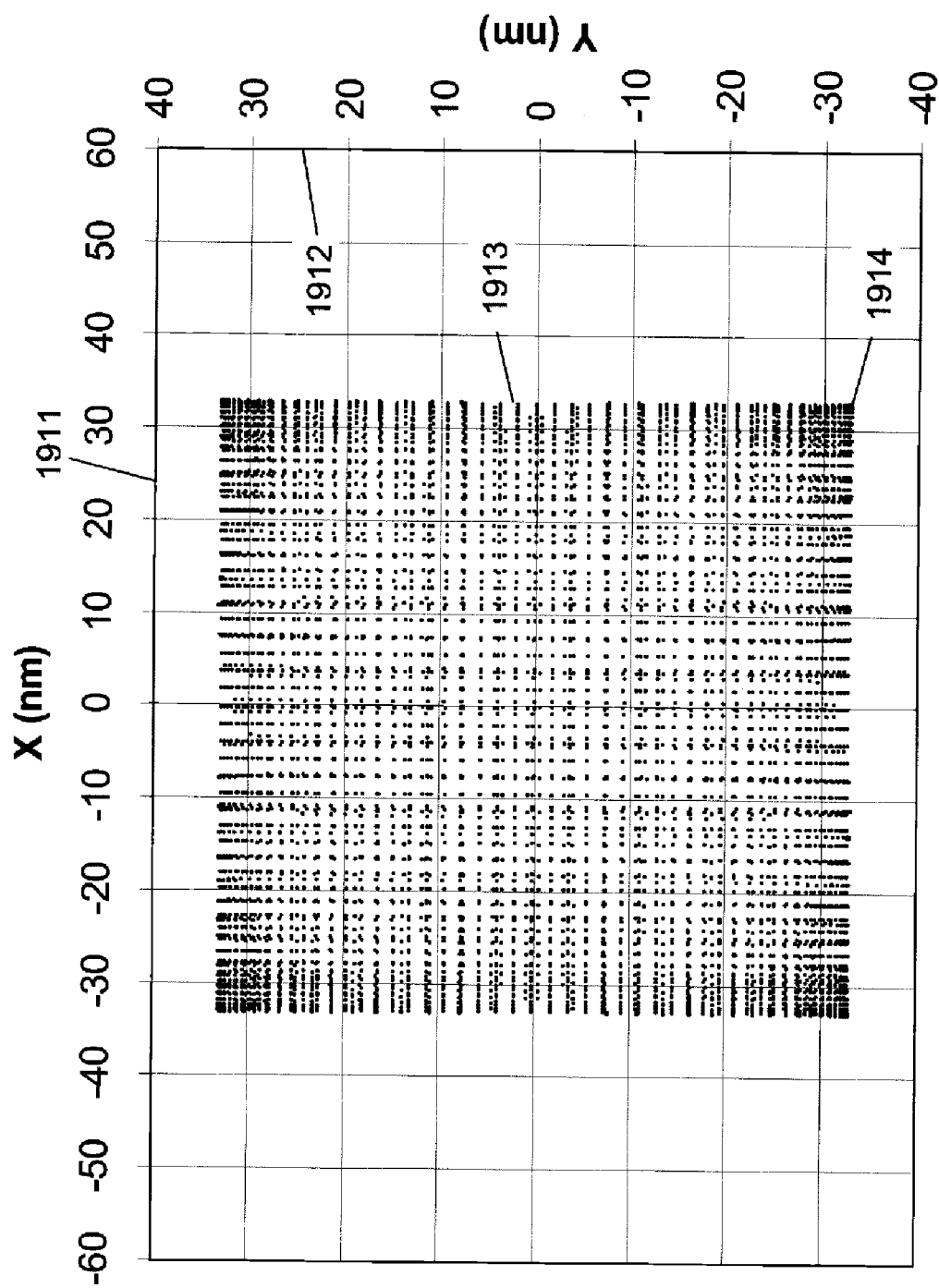
FIG. 21 shows a graph of beams transmitted to the substrate surface in a second embodiment of the present invention with Octupoles #2-4 activated.

FIG. 21 shows a graph of the trajectories 1913 along the X-axis 1911 and Y-axis 1912 at the substrate 1208 with the use of the second embodiment of the present invention to shape the beam into a square with corners 1914 in which elements 1204-1206 all have octupole excitations as shown in FIGS. 15-17. The corners 1914 of the beam are now sharp, which may be useful for lithography applications with substantial blurring in the resist—in these cases, the resist profile must be as sharp as possible to achieve the best final etched shape in the substrate 1208. Curves 1907 and 1908 in FIG. 20 show that there is substantial overlap of the trajectories 1913 in FIG. 21—this overlap can be seen from the fact that both curves 1907 and 1908 show two different radii at the objective lens 1207 (axis 1902) for the same radius at substrate 1208 (axis 1901) in many cases. This overlap corresponds to a "folding over" of the beam on itself, thus making the beam smaller for a given number of trajectories reaching the substrate 1207—this is the same phenomenon seen in FIGS. 10-11 and FIGS. 18-19. Since the number of trajectories is proportional to the total beam current, this means that the beam current density at the substrate 1208 is increased compared with the case of first-order imaging (the conventional method of beam-shaping) in which there is no folding over of the trajectories at the substrate.

Figure 22:
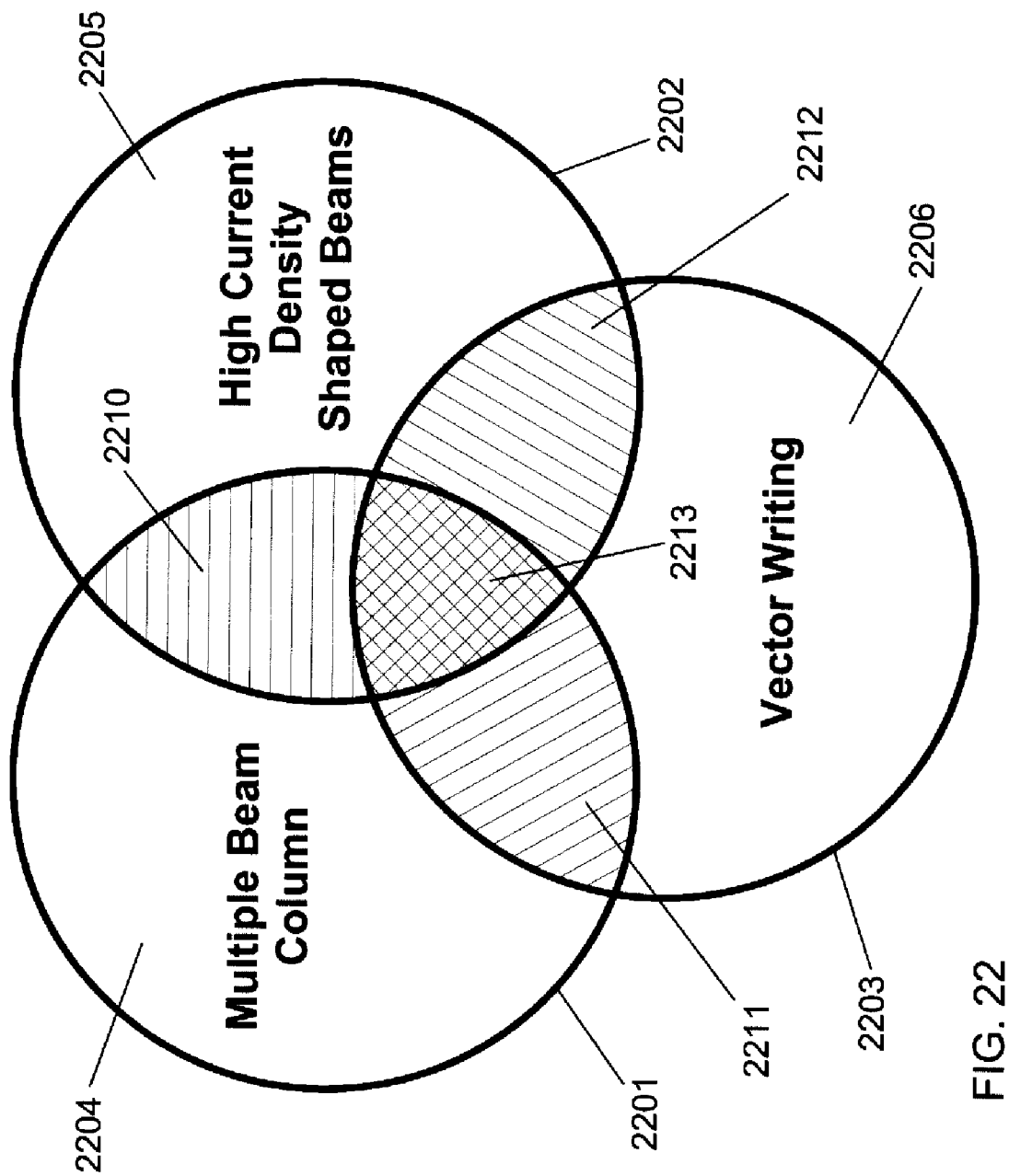
FIG. 22 shows a Venn diagram illustrating the interactions of the three contributions to the system throughput: 1) multiple beam column, 2) the high current density shaped beams, and 3) vector scanning.

FIG. 22 shows a Venn diagram illustrating the interactions of the three contributions to the system throughput:

1) Multiple beam column assembly (circle 2201 enclosing areas 2204, 2210, 2211, and 2213)—a column assembly which can produce multiple electron beams is described in U.S. Pat. No. 6,943,351 B2, "Multiple Column Charged Particle Optics Assembly" issued Sep. 13, 2005, incorporated by reference herein. Clearly, increasing the number of beams which are simultaneously writing on a substrate will lead to a nearly-proportional increase in writing throughput. The multiple beam column technology described in the reference may be applied to the generation of both one- and two-dimensional arrays of beams, with inter-beam spacings in the range of 30 mm in X-Y, where X and Y are the coordinates in the plane of the substrate. Typical arrays of beams might comprise up to 10 beams in a line or 10×10 beams in a two-dimensional array. Area 2204 represents a system with a multiple beam column assembly using conventional low current density beam shaping and raster scanning.

2) High current density shaped beams (circle 2202 enclosing areas 2205, 2210, 2212, and 2213)—one method for achieving high current density shaped beams is the present invention. Another method for achieving high current density shaped beams is described in U.S. Patent Application Publication No. 2006/0145097 A1, "Optics for Generation of High Current Density Patterned Charged Particle Beams" filed Oct. 7, 2004, incorporated by reference herein. Both methods are capable of being implemented in the multiple beam column assembly described in the section above. The key requirement for this is the need for each column to fit within the small available X-Y footprint (typically, approximately 30 mm×30 mm) within the multiple beam column assembly. This requirement for a small column footprint generally precludes the use of complex columns with many lenses, apertures and deflectors, as are commonly used in the production of lower current density shaped beams as is familiar to those skilled in the art. The increase in throughput due to increased current density in the beam is almost proportional to the magnitude of the current density increase, assuming that blanking times between successive flashes are reasonably short compared to the flash (i.e., writing) times. In the beam shaping methods described above, current density increases of 25 to >50 times over the conventional beam shaping approaches are possible. Area 2205 represents a system with a single column using a high current density shaped beam and raster scanning.

3) Vector scanning (circle 2203 enclosing areas 2206, 2211, 2212, and 2213)—the third contribution to throughput comes from the method of deflecting the beam around on the substrate. There are two widely-used scanning methods: 1) raster-scanning where the beam always traverses an X-Y pattern and is blanked on/off to write the pattern, and 2) vector scanning where the beam is moved directly from the position of a flash to the position of the next flash. The raster approach has the benefits of greater electronic simplicity at the expense of slower writing since the beam spends a lot of time over regions not to be written (where the beam is blanked). The vector scanning approach is more complex electronically, but has the substantial benefit of reducing writing times since the beam needs to be blanked a smaller percentage of the overall writing time. Depending on the pattern density, throughput increases due to vector scanning may range from 2× to 5× compared with raster scanning. Area 2206 represents a single column system using a low current density shaped beam and vector scanning (this is the prior art shaped beam approach).

Clearly to obtain the largest increases in writing throughputs, it is advantageous to combine two or all three of these contributions in one system. There are four possibilities:

1) Multiple beam column assembly with high current density shaped beams using raster scanning (area 2210)—the throughput advantage here is the product of the number of columns (10-100×) and the current density increase (25-50×)—giving an overall potential throughput increase of (250-5000×).
2) Multiple beam column assembly with low current density shaped beams and vector scanning (area 2211)—the throughput advantage here is the product of the number of columns (10-100×) and the vector scanning throughput increase (2-5×)—giving an overall potential throughput increase of (20-500×).
3) Single beam column with a high current density shaped beam and vector scanning (area 2212)—the throughput advantage here is the product of the current density increase (25-50×) and the vector scanning throughput increase (2-5×)—giving an overall potential throughput increase of (50-250×).
4) Multiple beam column assembly with a high current density shaped beam and vector scanning (area 2213)—this represents the ultimate throughput improvement situation, since the advantage here is the product of the number of columns (10-100×), the current density increase (25-50×), and the vector scanning throughput increase (2-5×)—giving an overall potential throughput increase of (500-25000×).

Some examples of the parameters for combinations of multiple beam columns, high current density shaped beams and vector scanning to specify a high throughput lithography system of the invention are given below.

A first example is a system with a multiplicity, N, of columns, each with a high current density charged particle shaped-beam which has a current density, $I_a$, and an area A, at the surface of the substrate, which satisfy the equations:

$I_a \geq 1000$ Ampères per square centimeter;

$300 \geq N \geq 10$;

$A = p^2$; and $120 > p > 10$ nanometers.

A second example is a system with a multiplicity, M, of columns, each with a high current density charged particle shaped-beam which has a current density, $I_b$, and an area B, at the surface of the substrate, which satisfy the equations:

$I_b > 5000$ Ampères per square centimeter;

$100 \geq M \geq 10$;

$B = q^2$; and $120 > q > 20$ nanometers.

Figure 23:
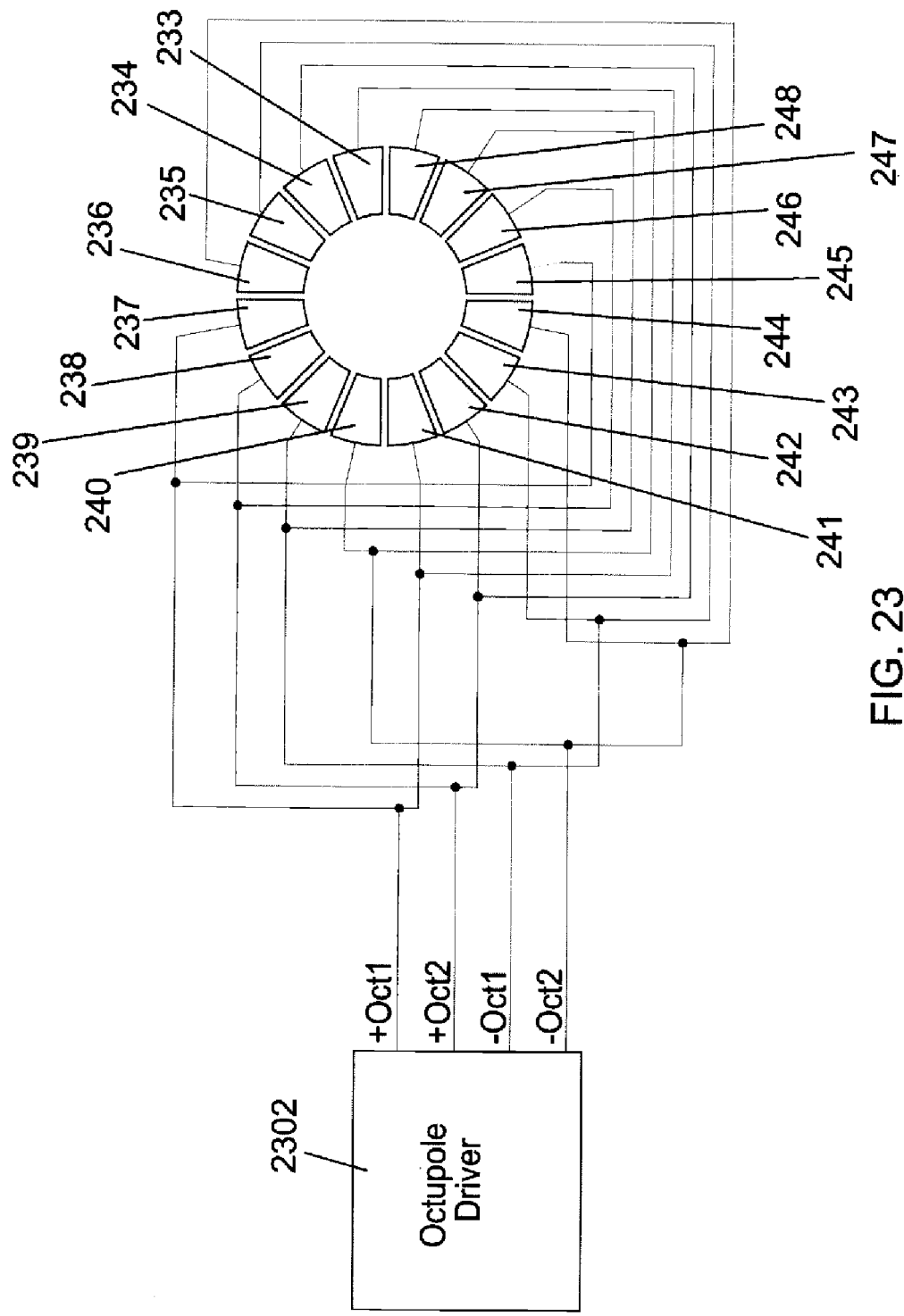
FIG. 23 shows a schematic circuit diagram of drive electronics for the 16-pole element in FIG. 7 for the first embodiment.

FIG. 23 shows a schematic circuit diagram of drive electronics for the 16-pole element in FIG. 7 used for element 203 in the first embodiment. Since element 203 only requires an octupole excitation, the voltages on poles 233-248 are driven by octupole driver 2302 (providing four signals: +Oct1, +Oct2, −Oct1, and −Oct2). Connections to the 16 poles 233-248 are as shown. The 4-fold symmetry inherent in an octupole excitation means that each of the four octupole signals is connected to four poles spaced 90° apart azimuthally around the optical axis. For example, signal +Oct1 connects to poles 233, 237, 241, and 245. Signals Oct1 and Oct2 are determined by the required rotation angle, θ, for the shaped beam. Table I illustrates some representative values for the voltages on poles 233-248 for four different orientations of a shaped beam. The general formulas for the voltage signals are:

$$Oct1 = A \cos[4\theta + 45°]$$

$$Oct2 = A \cos[4\theta + 135°]$$

where A<0 is a particular voltage determined by the column optics design. Note that any rotation angle θ>90° is equivalent to an angle between 0° and 90° due to the 4 θ term.

Figure 24:
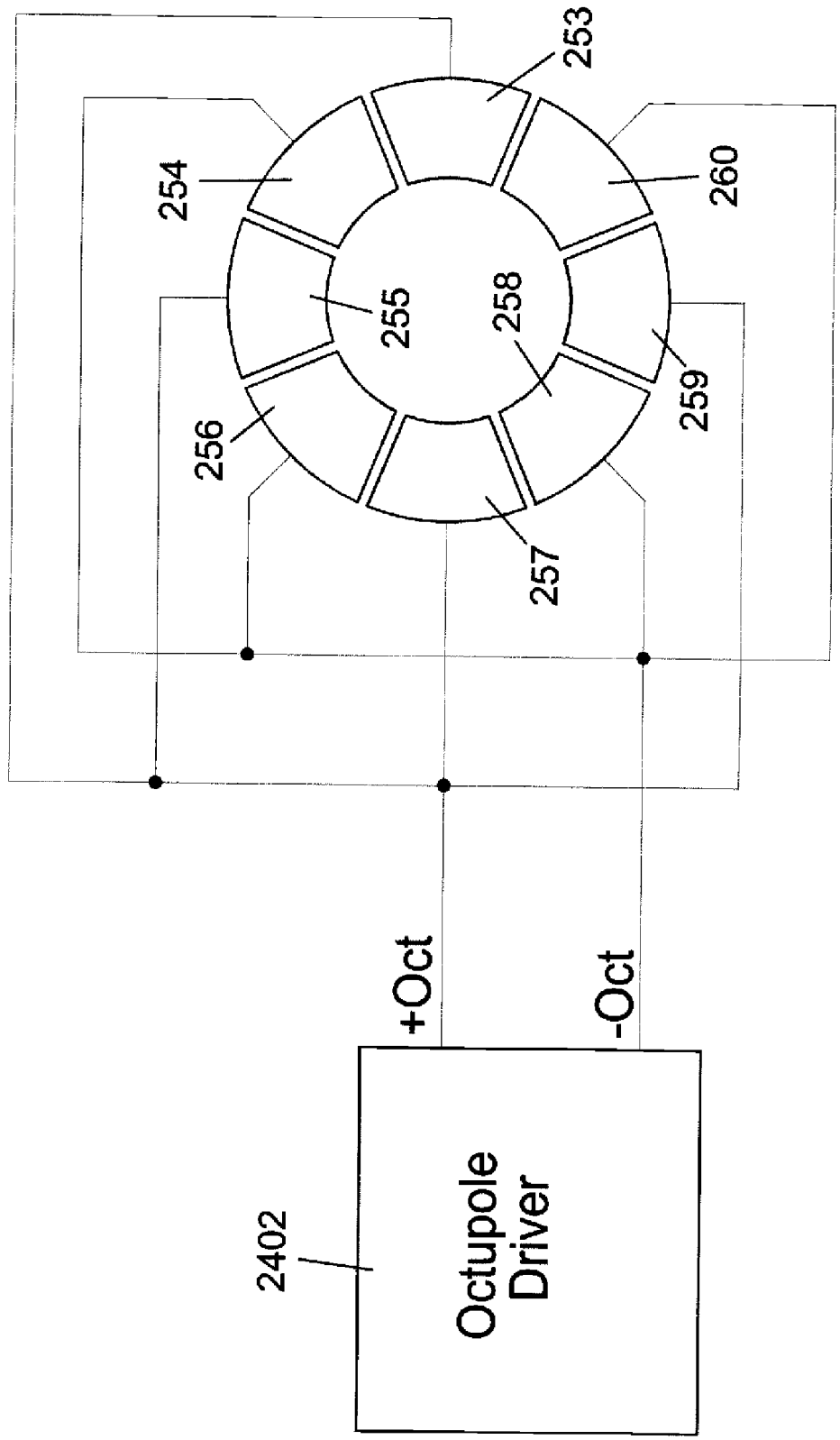
FIG. 24 shows a schematic circuit diagram of drive electronics for the 8-pole element in FIG. 8 for the first embodiment.

FIG. 24 shows a schematic circuit diagram of drive electronics for the 8-pole element in FIG. 8 used for element 203 in the first embodiment. Since element 203 only requires an octupole excitation, the voltages on poles 253-260 are driven by octupole driver 2402 (providing two signals: +Oct and −Oct). Connections to the 8 poles 253-260 are as shown. The 4-fold symmetry inherent in an octupole excitation means that each of the two octupole signals is connected to four poles spaced 90° apart azimuthally around the optical axis. For example, signal +Oct connects to poles 253, 255, 257, and 259. Signal Oct is determined by the required rotation angle, θ, for the octupole excitation of the 8-pole element, as is familiar to those skilled in the art. Table II illustrates some representative values for the voltages on poles 253-260 for two different orientations of a shaped beam. Since an 8-pole element can only generate two orientations of an octupole electrostatic field (θ=0° and 45°), the general formula for the voltage signal is:

$$Oct = A\cos[4\theta]$$
$$= A \text{ (for } \theta = 0°) \text{ or}$$
$$= -A \text{ (for } \theta = 45°)$$

where A<0 is a particular voltage determined by the column optics design. Note that any rotation angle θ>90° is equivalent to an angle between 0° and 90° due to the 4θ term.

Figure 25:
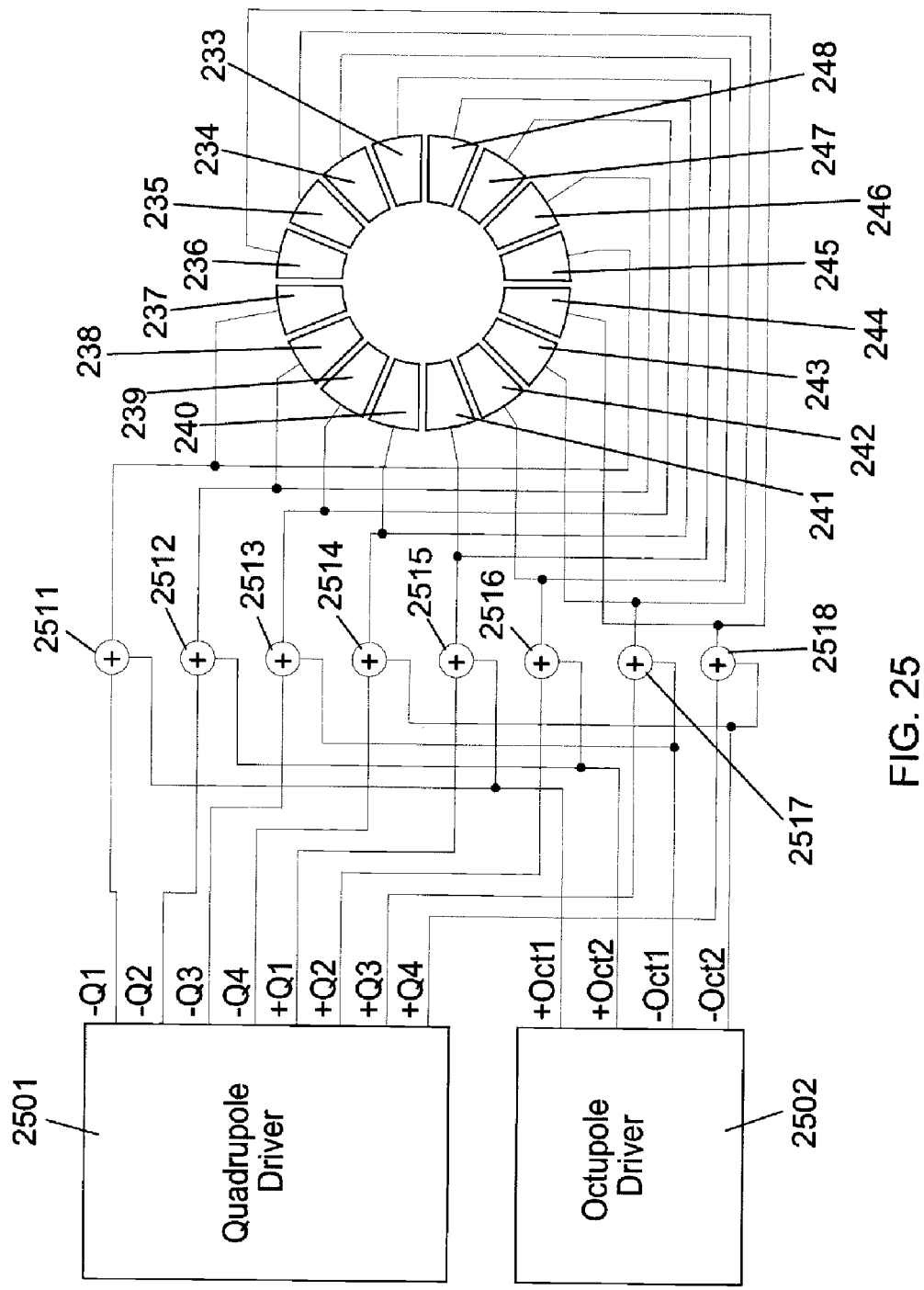
FIG. 25 shows a schematic circuit diagram of drive electronics for the 16-pole element in FIG. 7 for the second embodiment.

FIG. 25 shows a schematic circuit diagram of drive electronics for the 16-pole element in FIG. 7 used for elements 1203-1206 in the second embodiment. Since elements 1204-1206 require both quadrupole and octupole excitations (element 1203 is a pure quadrupole), the voltages on poles 233-248 are driven by both quadrupole driver 2501 (providing eight signals: +Q1, +Q2, +Q3, +Q4, −Q1, −Q2, −Q3, and −Q4) and by octupole driver 2502 (providing four signals: +Oct1, +Oct2, −Oct1, and −Oct2). Connections to the 16 poles 233-248 are as shown. The two-fold symmetry inherent in a quadrupole excitation means that each of the eight quadrupole signals is connected to two poles spaced 180° apart azimuthally around the optical axis. For example, signal +Q1 connects to poles 233 and 241. Signals Q1, . . . , Q4 are determined by the required rotation angle, θ, for the shaped beam. Table V illustrates some representative values for the quadrupole voltages on poles 233-248 for eight different orientations of a line focus. Note that the orientation angles for the line foci are different from the orientation angle for the shaped beam. For example, a shaped beam with a rotation angle θ would require the following line focus rotation angles (see FIGS. 12A-13B and Table V):

Element 1203: excitation has a θ+45° rotation—gives a line focus at θ+45° at element 1204
Element 1204: excitation has a θ+135° rotation—gives a line focus at θ+135° at element 1205
Element 1205: excitation has a θ+45° rotation—gives a round beam at element 1206
Element 1206: excitation has a θ+135° rotation—gives a parallel round beam entering lens 1207

The 4-fold symmetry inherent in an octupole excitation means that each of the four octupole signals is connected to four poles spaced 90° apart azimuthally around the optical axis. For example, signal +Oct1 connects to poles 233, 237, 241, and 245. Signals Oct1 and Oct2 are determined by the required rotation angle, θ, for the octupole excitation of the 16-pole element, as is familiar to those skilled in the art. Table I illustrates some representative values for the voltages on poles 233-248 for four different orientations of a square beam. The general formulas for the voltage signals are:

$$Oct1 = A \cos[4\theta + 45°]$$

$$Oct2 = A \cos[4\theta + 135°]$$

where A<0 is a particular voltage determined by the column optics design. Note that any rotation angle θ>90° is equivalent to an angle between 0° and 90° due to the 4 θ term. Additive elements 2511-2518 combine the quadrupole and octupole voltages derived above. Additive elements 2511-2518 could be op-amp circuits if Q1-Q4 and Oct1-Oct2 are analog signals, or they could be digital circuitry if Q1-Q4 and Oct1-Oct2 are digital signals. In the latter case, additive elements 2511-2518 would also perform a digital-to-analog conversion to generate final (analog) drive voltages for poles 233-248.

Figure 26:
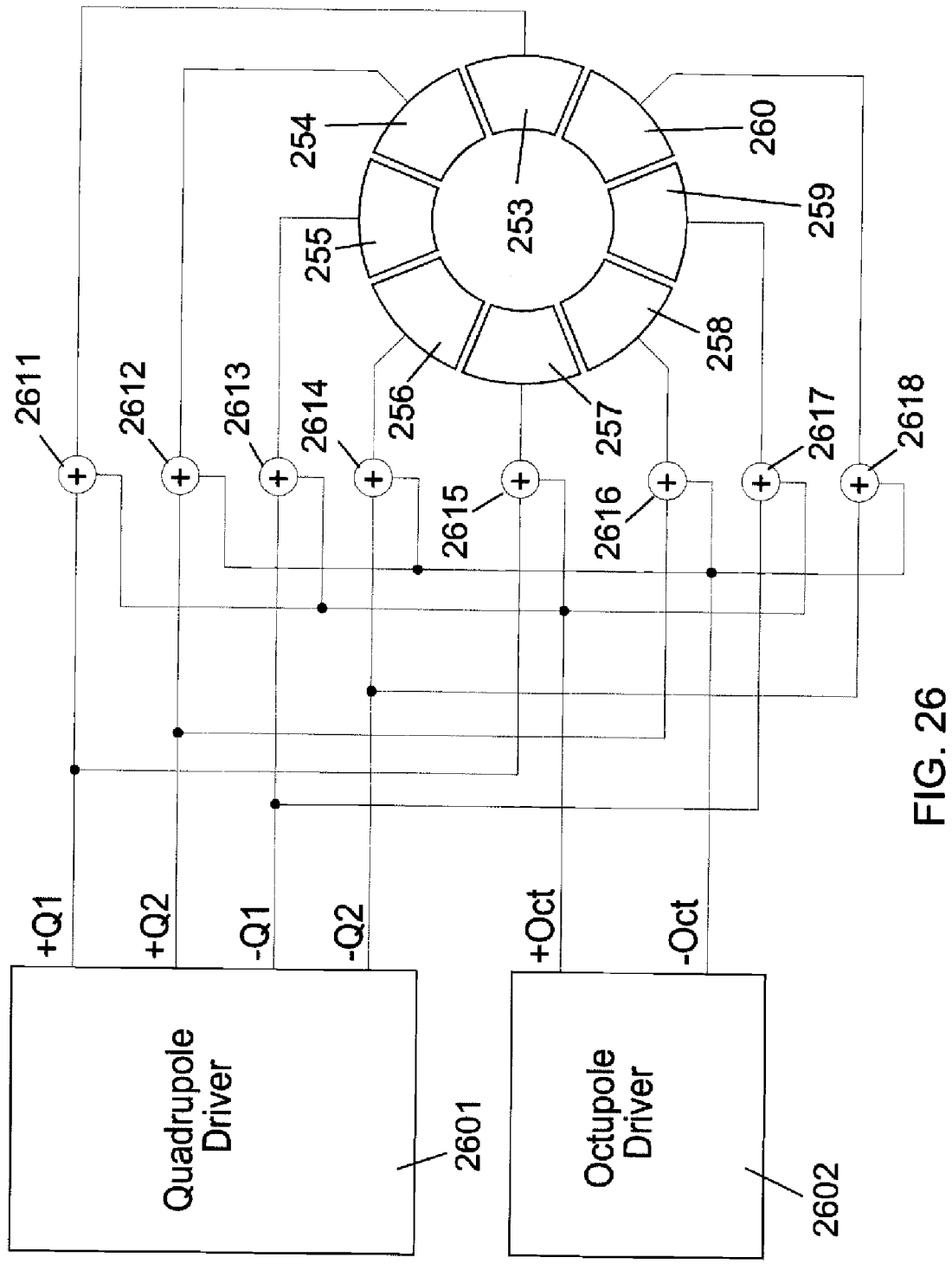
FIG. 26 shows a schematic circuit diagram of drive electronics for the 8-pole element in FIG. 8 for the second embodiment.

FIG. 26 shows a schematic circuit diagram of drive electronics for the 8-pole element in FIG. 8 used for elements 1203-1206 in the second embodiment. Since elements 1204-1206 require both quadrupole and octupole excitations (element 1203 is a pure quadrupole), the voltages on poles 233-248 are driven by both quadrupole driver 2601 (providing four signals: +Q1, +Q2, −Q1, and −Q2) and by octupole driver 2602 (providing two signals: +Oct and −Oct1). Connections to the eight poles 253-260 are as shown. The two-fold symmetry inherent in a quadrupole excitation means that each of the four quadrupole signals is connected to two poles spaced 180° apart azimuthally around the optical axis. For example, signal +Q1 connects to poles 253 and 257. Signals Q1 and Q2 are determined by the required rotation angle, θ, for the shaped beam. Table VI illustrates some representative values for the quadrupole voltages on poles 253-260 for four different orientations of a line focus. Note that the orientation angles for the line foci are different from the orientation angle for the shaped beam. For example, a shaped beam with a rotation angle θ would require the following line focus rotation angles (see FIGS. 12A-13B and Table VI):

Element 1203: excitation has a θ+45° rotation—gives a line focus at θ+45° at element 1204
Element 1204: excitation has a θ+135° rotation—gives a line focus at θ+135° at element 1205
Element 1205: excitation has a θ+45° rotation—gives a round beam at element 1206
Element 1206: excitation has a θ+135° rotation—gives a parallel round beam entering lens 1207

The 4-fold symmetry inherent in an octupole excitation means that each of the two octupole signals is connected to four poles spaced 90° apart azimuthally around the optical axis. For example, signal +Oct connects to poles 253, 255, 257, and 259. Signal Oct is determined by the required rotation angle, θ, for the octupole excitation of the 8-pole element, as is familiar to those skilled in the art. Table II illustrates some representative values for the voltages on poles 253-260 for two different orientations of a square beam. Since an 8-pole element can only generate two orientations of an octupole electrostatic field (θ=0° and 45°), the general formula for the voltage signal is:

$$Oct = A\cos[4\theta]$$
$$= A \text{ (for } \theta = 0°\text{) or}$$
$$= -A \text{ (for } \theta = 45°\text{)}$$

where A<0 is a particular voltage determined by the column optics design. Note that any rotation angle θ>90° is equivalent to an angle between 0° and 90° due to the 4 θ term. Additive elements 2611-2618 combine the quadrupole and octupole voltages derived above. Additive elements 2611-2618 could be op-amp circuits if Q1, Q2 and Oct are analog signals, or they could be digital circuitry if Q1, Q2 and Oct are digital signals. In the latter case, additive elements 2611-2618 would also perform a digital-to-analog conversion to generate final (analog) drive voltages for poles 253-260.

FIG. 27 shows a schematic view of a magnetic 16-pole optical element that can be used for octupole 203 (see FIG. 6) in a first embodiment of the present invention, and for elements 1203-1206 (see FIGS. 12A-13B) in a second embodiment of the present invention. The sixteen magnetic poles 2733-2748 are oriented relative to the X-axis 2731 and Y-axis 2732 as shown. The operation of magnetic 16-pole optical elements is essentially equivalent to the operation of electrostatic 16-pole optical elements, with the exception that the gaps in a magnetic 16-pole element are equivalent to the poles in an electrostatic 16-pole element. This can be seen from the fact that electrons are deflected perpendicularly to a magnetic field but are deflected parallel to an electric field. Each magnetic pole in FIG. 27 is fabricated from a material with a high magnetic permeability and has a corresponding excitation coil, for example pole 2733 is excited by coil 2713 which surrounds pole 2733 next to flux return ring 2702. Identical considerations apply to poles 2734-2748 with excitation coils 2714-2728, respectively. The purpose of flux return ring 2702 is to connect together the magnetic flux generated by coils 2713-2728 to avoid excessive stray flux from adversely affecting the electron beam in parts of the column away from the 16-pole optical element. One polarity of current in an excitation coil (e.g., 2713) will make the corresponding pole (pole 2733) a North pole, while the opposite current polarity will make the corresponding pole (pole 2733) a South pole, as is familiar to those skilled in the art of magnetic deflectors. It is also possible to avoid the use magnetic materials and fabricate the 16-pole optical element using only shaped coils. This approach has the advantage of avoiding hysteresis in the magnetic poles 2733-2748 and flux return ring 2702, but with the disadvantage of requiring much higher excitation currents in coils 2713-2728.

FIG. 28 shows a schematic view of a magnetic 8-pole (octupole) optical element that can be used as an alternative to the magnetic 16-pole element described in FIG. 27. The eight poles 2853-2860 are oriented relative to the X-axis 2851 and Y-axis 2852 as shown. As for FIG. 27, the operation of magnetic 8-pole optical elements is essentially equivalent to the operation of electrostatic 8-pole optical elements, with the exception that the gaps in a magnetic 8-pole element are equivalent to the Doles in an electrostatic 8-pole element. Each magnetic pole in FIG. 28 is fabricated from a material with a high magnetic permeability and has a corresponding excitation coil, for example pole 2853 is excited by coil 2813 which surrounds pole 2853 next to flux return ring 2802. Identical considerations apply to poles 2854-2860 with excitation coils 2814-2820, respectively. The purpose of flux return ring 2802 is to connect together the magnetic flux generated by coils 2813-2820 to avoid excessive stray flux from adversely affecting the electron beam in parts of the column away from the 8-pole optical element. One polarity of current in an excitation coil (e.g., coil 2813) will make the corresponding pole (pole 2853) a North pole, while the opposite current polarity will make the corresponding pole (pole 2853) a South pole, as is familiar to those skilled in the art of magnetic deflectors. It is also possible to avoid the use magnetic materials and fabricate the 16-pole optical element using only shaped excitation coils. This approach has the advantage of avoiding hysteresis in the magnetic poles 2833-2740 and flux return ring 2802, but with the disadvantage of requiring much higher excitation currents in coils 2813-2820.

Table III shows a comparison of the relative advantages and disadvantages of the two octupole implementations shown in FIGS. 27 and 28. The key determinant between the two implementations would be whether all orientations of the beam shape are required for patterning the substrate. In general, usually only orientations along 0° and 45° are needed, so the simpler 8-pole implementation in FIG. 28 would be preferred. If, however, all orientations are required, then it is necessary to use the more complex 16-pole implementation in FIG. 27.

The second embodiment is discussed herein with either four electrostatic 8N-pole optical elements or four magnetic 8N-pole optical elements. It is also possible to implement the second embodiment with a combination of 1-3 electrostatic 8N-pole optical elements and 1-3 magnetic 8N-pole optical elements, providing that there is a total of four 8N-pole optical elements.

Both the first and second embodiments may be implemented using combined electrostatic/magnetic 8N-pole optical elements, thereby enabling partial or complete correction for chromatic aberrations in the first- and third-order deflections—the use of combined electrostatic and magnetic optical elements for chromatic aberration correction is familiar to those skilled in the art.

The second embodiment may also be implemented using a configuration in which the first 8N-pole optical element has combined quadrupole/octupole excitations instead of, or in addition to, the combined quadrupole/octupole excitation on the fourth 8N-pole optical element. An advantage of this configuration is that two weaker octupole excitations (requiring may be used instead of the single, stronger, octupole excitation on the fourth 8N-pole optical element described above. A disadvantage of this configuration is that more complex electronics is required to drive the first 8N-pole optical element since it is required to generate both quadrupole and octupole fields, instead of only the quadrupole field described above.

TABLE VII

Parameters assumed for the calculations modeling the first embodiment.

| Parameter | Lenses | | Octupoles | |
|---|---|---|---|---|
| Focal length lens 202 | arbitrary | | | |
| Strength Octupole 203 | | | −0.000250 | $1/mm^3$ |
| Focal Length Lens 204 | 10.006 | mm | | |
| Spherical Aberration Lens 204 | 0.003 | $1/mm^3$ | | |
| Distance Lens 204 to Substrate 205 | 9.9997 | mm | | |

TABLE VIII

Parameters assumed for the calculations modeling the second embodiment.

| Parameter | Quadrupoles/ Lenses | | Octupoles | |
|---|---|---|---|---|
| Focal length lens 1202 | arbitrary | | | |
| Strength Quadrupole #1 1203 | 0.06667 | 1/mm | 0.000000 | $1/mm^3$ |
| Strength Quadrupole/ Octupole #2 1204 | −0.06667 | 1/mm | −0.000009 | $1/mm^3$ |
| Strength Quadrupole/ Octupole #3 1205 | 0.06667 | 1/mm | −0.000009 | $1/mm^3$ |
| Strength Quadrupole/ Octupole #4 1206 | −0.06667 | 1/mm | −0.000180 | $1/mm^3$ |
| Focal Length Lens 1207 | 10.006 | mm | | |
| Spherical Aberration Lens 1207 | 0.003 | $1/mm^3$ | | |
| Distance Lens 1207 to Substrate 1208 | 9.9997 | mm | | |

The invention claimed is:

1. A charged particle shaped beam column, comprising:
a charged particle source;
a gun lens configured to provide a charged particle shaped beam approximately parallel to the optic axis of said column;
an objective lens configured to form said charged particle shaped beam on the surface of a substrate, wherein the disk of least confusion of said objective lens does not coincide with the surface of said substrate;
a first optical element with 8N poles disposed radially symmetrically about the optic axis of said column, said first optical element being positioned between said gun lens and said objective lens, wherein N is an integer greater than or equal to 1 and wherein the 8N poles create a specific desired non-circular beam shape by selectively enlarging aberrations present in said charged particle shaped beam; and a first power supply configured to apply excitations to said 8N poles of said first optical element to provide an octupole electromagnetic field.

2. A charged particle shaped beam column as in claim 1, wherein N equals 2 and said octupole electromagnetic field is rotatable about the optic axis.

3. A charged particle shaped beam column as in claim 1, wherein said charged particle shaped beam is a square beam.

4. A charged particle shaped beam column as in claim 1, wherein said octupole electromagnetic field is an electrostatic field and said excitations are voltages.

5. A charged particle shaped beam column as in claim 1, wherein said octupole electromagnetic field is a magnetic field and said excitations are currents.

6. A charged particle shaped beam column as in claim 1, further comprising:
   a second optical element with 8P poles disposed radially symmetrically about the optic axis of said column, said second optical element being positioned between said gun lens and said first optical element, wherein P is an integer greater than or equal to 1;
   a second power supply configured to apply excitations to said 8P poles of said second optical element to provide a first quadrupole electromagnetic field;
   a third optical element with 8Q poles disposed radially symmetrically about the optic axis of said column, said third optical element being positioned between said second optical element and said first optical element, wherein Q is an integer greater than or equal to 1;
   a third power supply configured to apply excitations to said 8Q poles of said third optical element to provide a first combined quadrupole and octupole electromagnetic field;
   a fourth optical element with 8R poles disposed radially symmetrically about the optic axis of said column, said fourth optical element being positioned between said third optical element and said first optical element, wherein R is an integer greater than or equal to 1; and
   a fourth power supply configured to apply excitations to said 8R poles of said fourth optical element to provide a second combined quadrupole and octupole electromagnetic field;
   wherein said first power supply is further configured to apply excitations to said 8N poles of said first optical element to provide both an octupole electromagnetic field and a second quadrupole electromagnetic field.

7. A charged particle shaped beam column as in claim 6, wherein:
   in a first plane containing the optic axis:
      said second and fourth optical elements and said second and fourth power supplies are configured to create a defocusing field; and
      said first and third optical elements and said first and third power supplies are configured to create a focusing field; and
   in a second plane containing the optic axis and perpendicular to said first plane:
      said second and fourth optical elements and said second and fourth power supplies are configured to create a focusing field; and
      said first and third optical elements and said first and third power supplies are configured to create a defocusing field.

8. A charged particle shaped beam column as in claim 6, wherein said octupole electromagnetic field, said first and second quadrupole electromagnetic fields, and said first and second combined quadrupole and octupole electromagnetic fields are electrostatic fields and said excitations are voltages.

9. A charged particle shaped beam column as in claim 6, wherein said octupole electromagnetic field, said first and second quadrupole electromagnetic fields, and said first and second combined quadrupole and octupole electromagnetic fields are magnetic fields and said excitations are currents.

10. A charged particle shaped beam column as in claim 1, further comprising a beam defining aperture centered on the optic axis and positioned between said charged particle source and said first optical element.

11. A method of forming a charged particle shaped beam in a charged particle optical column, comprising the steps of:
   forming a charged particle beam approximately parallel to the optic axis of said charged particle column;
   creating an octupole electromagnetic field to induce azimuthally dependent deflection of said charged particle beam, wherein the azimuthal angle is about the optic axis of said charged particle column, in a plane perpendicular to the optic axis; and
   forming a non-circular charged particle shaped beam on a substrate by controlling the deflections of said charged particle beam to enlarge aberrations present in said charged particle beam.

12. A method as in claim 11, wherein said octupole electromagnetic field is created by:
   a first optical element with 8N poles disposed radially symmetrically about the optic axis of said column, wherein N is an integer greater than or equal to 1; and
   a first power supply configured to apply excitations to said poles of said first optical element.

13. A method as in claim 12, wherein N equals 2.

14. A method as in claim 12, further comprising the steps of:
   creating a first combined octupole and quadrupole electromagnetic field to induce azimuthally dependent deflection of said charged particle beam;
   creating a second combined octupole and quadrupole electromagnetic field to induce further azimuthally dependent deflection of said charged particle beam; and
   creating a third combined octupole and quadrupole electromagnetic field to induce yet further azimuthally dependent deflection of said charged particle beam;
   wherein, said step of creating an octupole electromagnetic field further includes creating a quadrupole electromagnetic field.

15. A method as in claim 11, wherein said forming a charged particle shaped beam step is implemented by an objective lens, the disk of least confusion of said objective lens not coinciding with the surface of said substrate.

16. A method as in claim 1, wherein the charged particle is an electron.

17. A high throughput charged particle direct write lithography system comprising:
   a charged particle optical assembly configured to (1) produce a plurality M of high current density charged particle non-circular shaped-beams focused on the surface of a substrate and (2) vector scan said charged particle shaped-beams across the surface of said substrate;
   wherein each of said plurality of high current density charged particle shaped-beams has a current density, $I_a$, and an area A which satisfy the equations:
   $I_a \geq 1000$ Amperes per square centimeter;
   $300 \geq M \geq 10$;
   $A = p^2$; and
   $120 > p > 10$ nanometers;

wherein said charged particle optical assembly includes N charged particle columns, each of said charged particle columns forming a charged particle beam, each of said charged particle columns including at least one optical element with 8N poles disposed radially symmetrically about the optic axis of said column, N being an integer greater than or equal to 1, each of said optical elements being configured to produce azimuthally dependent deflection of said corresponding charged particle beam, the azimuthal angle being about the optic axis of said corresponding charged particle column, in a plane perpendicular to the optic axis; and wherein the 8N poles are used to shape the non-circular shaped beams by selectively enlarging aberrations present in said charged particle non-circular shaped-beams.

18. A charged particle direct write lithography system as in claim 17, wherein each of said columns further comprises:
a charged particle source;
a gun lens configured to provide a charged particle beam approximately parallel to the optic axis of said column;
an objective lens configured to form a high current density charged particle non-circular shaped-beam on the surface of a substrate, wherein the disk of least confusion of said objective lens does not coincide with the surface of said substrate; and
a first power supply configured to apply excitations to said 8N poles of said first optical element to provide an octupole electromagnetic field;
wherein said first optical element is positioned between said condenser lens and said objective lens.

19. A high throughput charged particle direct write lithography system comprising:
a charged particle optical assembly configured to (1) produce a plurality, M, of high current density charged particle non-circular shaped-beams focused on the surface of a substrate and (2) vector scan said charged particle shaped-beams across the surface of said substrate;
wherein each of said plurality of high current density charged particle shaped-beams has a current density, $I_a$, and an area A which satisfy the equations:
$I_a \geq 5000$ Amperes per square centimeter;
$100 \geq M \geq 10$;
$A = p^2$; and
$120 > p > 20$ nanometers;
wherein said charged particle optical assembly includes N charged particle columns, each of said charged particle columns forming a charged particle beam, each of said charged particle columns including at least one optical element with 8N poles disposed radially symmetrically about the optic axis of said column, N being an integer greater than or equal to 1, each said optical element being configured to produce azimuthally dependent deflection of said corresponding charged particle beam, the azimuthal angle being about the optic axis of said corresponding charged particle column, in a plane perpendicular to the optic axis; and
wherein the 8N poles are used to shape the non-circular shaped beams by selectively enlarging aberrations present in said charged particle non-circular shaped-beams.

* * * * *